(12) United States Patent
Saito

(10) Patent No.: US 12,708,018 B2
(45) Date of Patent: Aug. 11, 2026

(54) METHOD OF MANUFACTURING SEMICONDUCTOR DEVICE

(71) Applicant: FUJI ELECTRIC CO., LTD., Kawasaki (JP)

(72) Inventor: Takashi Saito, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 361 days.

(21) Appl. No.: 18/342,911

(22) Filed: Jun. 28, 2023

(65) Prior Publication Data

US 2024/0055392 A1 Feb. 15, 2024

(30) Foreign Application Priority Data

Aug. 12, 2022 (JP) ................................ 2022-128582

(51) Int. Cl.
*H10W 72/00* (2026.01)

(52) U.S. Cl.
CPC .... *H10W 72/073* (2026.01); *H10W 72/07331* (2026.01)

(58) Field of Classification Search
CPC ......... H01L 24/29; H01L 24/83; H01L 24/32; H01L 24/33; H01L 23/3735; H01L 24/27; H01L 23/49833; H01L 24/45; H01L 23/14; H01L 23/48; H01L 23/3107; H01L 23/562; H01L 24/48; H01L 23/49811; H01L 23/5385; H01L 23/3142; H01L 24/92; H01L 24/49; H01L 24/85; H01L 25/0655; H01L 24/73; H01L 25/50; H01L 25/072; H01L 23/49575; H01L 25/18; H01L 23/49562; H01L 23/49531; H01L 23/49844; H01L 2224/8384;
(Continued)

(56) References Cited

U.S. PATENT DOCUMENTS 8,915,418 B2 12/2014 Shiratori et al.
11,594,513 B2 2/2023 Mita et al.
(Continued)

FOREIGN PATENT DOCUMENTS

JP 2013-125769 A 6/2013
JP 2014-179419 A 9/2014
(Continued)

OTHER PUBLICATIONS

Japanese Office Action dated May 12, 2026 issued by Japan Patent Office for the corresponding Japanese Patent Application No. 2022-128582.

*Primary Examiner* — Mouloucoulaye Inoussa

(57) ABSTRACT

A method of manufacturing a semiconductor module includes: placing, on a lower hot plate, an insulating wiring substrate having an electrically-conductive pattern formed on an insulating substrate; placing sintered materials on the electrically-conductive pattern; placing semiconductor chips on the sintered materials; placing a cushioning material over the semiconductor chips; placing an upper hot plate on the cushioning material; and sintering the sintered materials by pressurizing and heating the sintered materials via the cushioning material and the electronic components by the upper hot plate in a state where a space is provided between the upper hot plate and a part of the insulating substrate.

13 Claims, 14 Drawing Sheets

(58) Field of Classification Search
CPC ... H01L 2224/29139; H01L 2224/2711; H01L 2224/33181; H01L 2224/32225; H01L 2224/83447; H01L 2224/3303; H01L 2224/83192; H01L 2224/83191; H01L 2224/27438; H01L 2224/83201; H01L 2924/10272; H01L 2224/73215; H01L 2224/2612; H01L 2224/48175; H01L 2224/73265; H05K 7/209; H02M 7/003
See application file for complete search history.

(56) References Cited

U.S. PATENT DOCUMENTS

| | | | | |
|---|---|---|---|---|
| 2014/0263581 | A1 | 9/2014 | Shiratori et al. | |
| 2017/0338176 | A1* | 11/2017 | Tsuyuno | H01L 23/49838 |
| 2020/0286865 | A1* | 9/2020 | Chew | H01L 24/84 |
| 2021/0057372 | A1* | 2/2021 | Oh | H01L 25/50 |
| 2021/0242165 | A1 | 8/2021 | Mita et al. | |
| 2021/0407954 | A1* | 12/2021 | Yoshihara | H01L 23/373 |
| 2023/0187403 | A1* | 6/2023 | Hong | H01L 24/32<br>257/773 |
| 2023/0369181 | A1* | 11/2023 | Scharf | H01L 24/32 |
| 2024/0404981 | A1* | 12/2024 | Yoshikawa | H01L 24/45 |

FOREIGN PATENT DOCUMENTS

| | | | |
|---|---|---|---|
| JP | 2014-239170 | A | 12/2014 |
| JP | 2021-150548 | A | 9/2021 |
| WO | 2019/208072 | A1 | 10/2019 |

* cited by examiner

METHOD OF MANUFACTURING SEMICONDUCTOR DEVICE

CROSS-REFERENCE TO RELATED APPLICATION

This application claims benefit of priority under 35 USC 119 based on Japanese Patent Application No. 2022-128582 filed on Aug. 12, 2022, the entire contents of which are incorporated by reference herein.

BACKGROUND OF THE INVENTION

1. Field of the Invention

The present invention relates to a method of manufacturing a semiconductor module including an electronic component.

2. Description of the Related Art

Semiconductor modules mainly for industrial use include an insulating substrate, a semiconductor chip joined to the insulating substrate by solder, a heat dissipation member to which the insulating substrate is joined by solder, and heat dissipating fins to which the heat dissipation member is attached via a thermal compound. Further, in the automotive field, semiconductor modules having a direct water-cooled cooling structure and having a structure in which an insulating substrate is joined to cooling fins by solder with no use of a thermal compound are also used. Currently, soldering is used for joining between a semiconductor chip and an insulating substrate. However, for the purpose of achieving a high heat-resisting property, a high heat dissipation property, a high reliability, or the like, research and development of sintering joining using nanoparticles or microparticles of silver or the like as a method for joining a semiconductor chip to an insulating substrate has been promoted.

WO 2019/208072 A1 discloses that "in a case where there is a difference between chips in terms of a deviation from an ideal parallel posture on a pair of press surfaces, an inclination thereof, or a height from the surface of a substrate to the top surface of a chip, a cushioning material sheet can fulfill a cushion function to substantially absorb the difference to reduce and eliminate the difference." Further, WO 2019/208072 A1 discloses that "in a high-temperature pressurization process, when a cushioning material sheet to use excessively deforms by compression or deforms to hang down to embed a chip on a substrate and form a closed space around the chip (a space closed by the substrate, the chip, and the cushioning material sheet), a component volatilizing and leaking from a material layer for sintering joining may be deposited on the substrate. When such deposits are formed, a cleaning process to clear the deposits is necessary additionally, and this is unfavorable. The abovementioned cushioning material sheet that is hard to excessively deform by compression or deform to hang down in the abovementioned sintering joining step via the high-temperature pressurization process is suitable to avoid such a problem."

JP 2021-150548 A discloses that "since gas is generated from a sintered material, it is preferable that a cushioning layer do not seal around a semiconductor chip and the sintered material." Further, FIG. 14 in JP 2021-150548 A discloses that "the thickness of an elastic member changes before and after pressurization, and there is a gap between the cushioning layer and a second circuitry layer provided on an insulating circuit substrate at the time of pressurization."

JP 2014-239170 A discloses that "only by just providing a pressure equalizing sheet, the pressure equalizing sheet hangs down during pressurization to cover a joined part, and there is such a concern that a component decomposed and degassed from an organic protective film stays in a space formed at the joined part. In this case, a circuit member or the like near the space is contaminated, so that the reliability of the circuit member or the like might decrease." Further, JP 2014-239170 A discloses that "at the time of pressurization, the pressure equalizing sheet warps in a direction more separated from a power semiconductor device than a pressure-applying surface. This consequently prevents a space near the power semiconductor device from being blocked by the pressure equalizing sheet, so that volatile ingredients of the organic protective film do not stay in the space near the power semiconductor device."

In a case where an electronic component such as a semiconductor chip is connected to an insulating substrate by sintering, it is necessary to pressurize a sintered material.

In a case where the sintered material is pressurized via the electronic component, a cushioning material is used to absorb irregularities or unevenness in height on the surface of the electronic component. Further, in a case where a plurality of electronic components or electronic components having different heights are joined by pressurizing at a time, a thick cushioning material is required to equalize the pressure applied to the plurality of electronic components.

When a thick cushioning material is used at the time of sintering of the sintered material, the cushioning material completely covers the surrounding of the electronic component and the sintered material and comes into contact with the surface of the insulating substrate. This causes the cushioning material to inhibit gas discharged from the sintered material at the time of pressurizing the sintered material from escaping outside. As a result, the gas may remain as deposits such as carbide on the surface of the insulating substrate. In steps after sintering in a manufacturing process of a semiconductor module, the deposits reduce solderability and cause voids in a gel or a resin seal or separation of sealing resin.

SUMMARY OF THE INVENTION

An object of the present invention is to provide a method of manufacturing a semiconductor module that can reduce the occurrence of defects in steps after a joining step and reduce a manufacturing cost.

An aspect of the present invention inheres in a method of manufacturing a semiconductor module including: placing, on a lower hot plate, an insulating wiring substrate having an electrically-conductive pattern formed on an insulating substrate; placing sintered materials on the electrically-conductive pattern; placing electronic components on the sintered materials; placing a cushioning material over the electronic components; placing an upper hot plate on the cushioning material; and sintering the sintered materials by pressurizing and heating the sintered materials via the cushioning material and the electronic components by the upper hot plate in a state where a space is provided between the upper hot plate and a part of the insulating substrate.

BRIEF DESCRIPTION OF THE DRAWINGS

FIG. 12 is a plan view illustrating an example of a schematic configuration of an insulating wiring substrate provided in a semiconductor module manufactured by a method of manufacturing a semiconductor module according to a third embodiment of the present invention in a state where semiconductor chips are mounted on the insulating wiring substrate:

DETAILED DESCRIPTION

Each embodiment of the present invention describes a device or a method to embody the technical idea of the present invention, and the technical idea of the present invention does not specify a material, a shape, a structure, an arrangement, and the like of a component part to those described below.

Various changes can be added to the technical idea of the present invention within a technical scope defined by claims described in claims.

First Embodiment

A manufacture of a semiconductor module according to a first embodiment of the present invention will be described with reference to FIG. 1 to FIG. 9.

(Configuration of Semiconductor Module)

Figure 1:
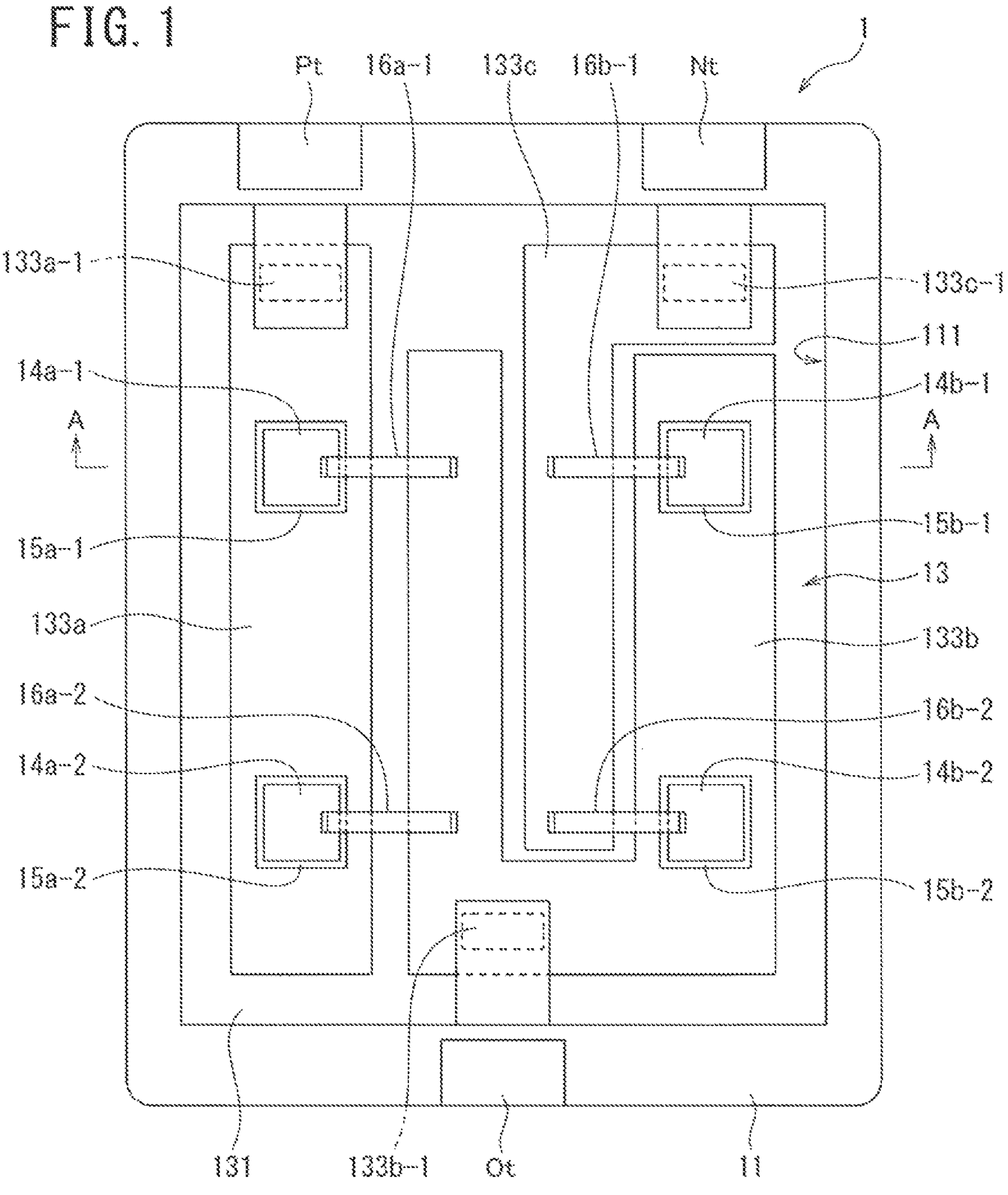
FIG. 1 is a plan view illustrating an example of a schematic configuration of a semiconductor module manufactured by a method of manufacturing a semiconductor module according to a first embodiment of the present invention.
Figure 2:
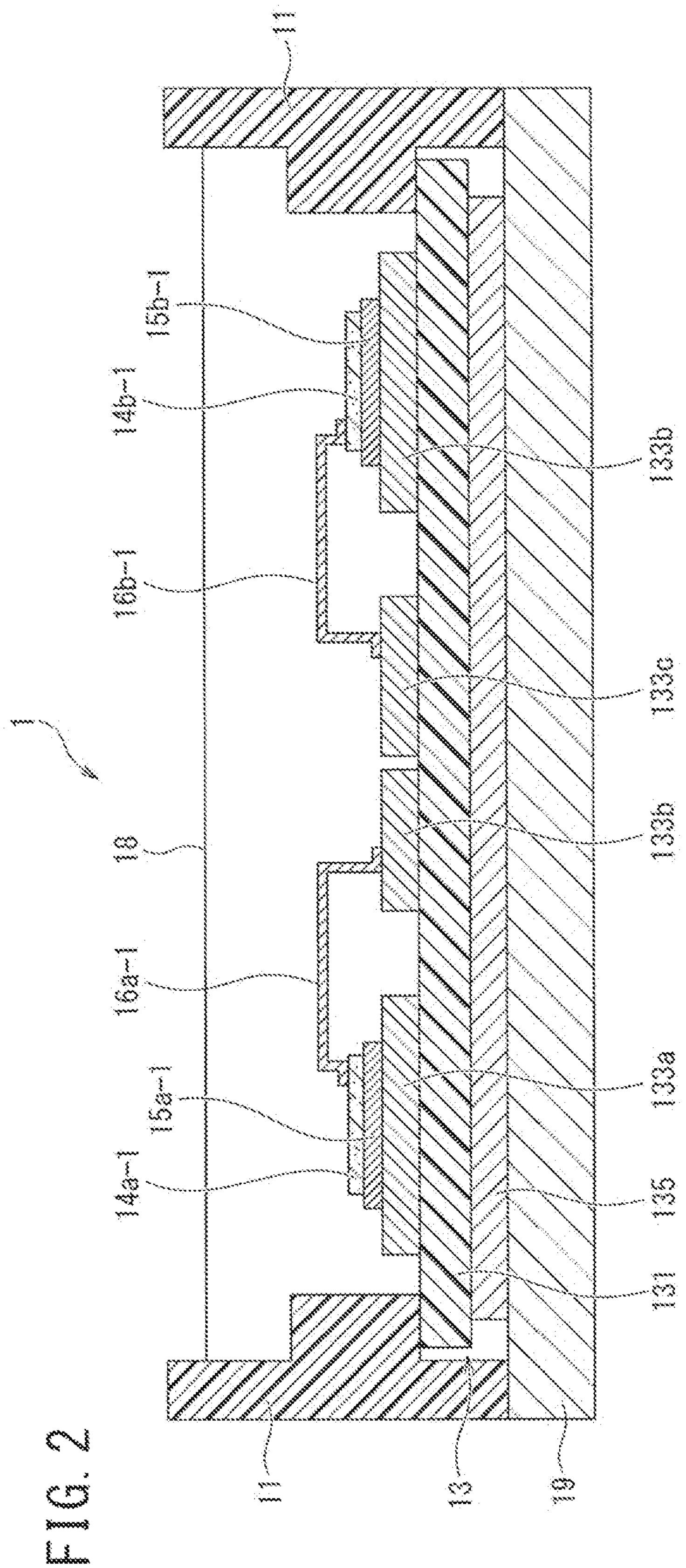
FIG. 2 is a sectional view illustrating the example of the schematic configuration of the semiconductor module manufactured by the method of manufacturing the semiconductor module according to the first embodiment of the present invention.

A schematic configuration of a semiconductor module 1 manufactured by the method of manufacturing the semiconductor module according to the present embodiment will be described with reference to FIG. 1 and FIG. 2. The semiconductor module 1 will be described with a single-phase power conversion module that can perform DC-AC conversion being taken as an example, for example. FIG. 1 is a plan view (a view viewed from a side where a semiconductor chip 14*a*-1 and so on are mounted) illustrating an example of a schematic configuration of the semiconductor module 1. In FIG. 1, a sealing resin 18 is not illustrated to facilitate understanding. FIG. 2 is a view schematically illustrating a section of the semiconductor module 1 taken along a line A-A in FIG. 1.

As illustrated in FIG. 1, the semiconductor module 1 includes a case 11 defining a space 111. The case 11 is made of insulating thermoplastic resin, for example. The case 11 has a rectangular frame shape in a plan view, for example. Here, a plan view means that a surface of an insulating substrate 131 (described later in detail) on which electrically-conductive patterns 133*a*. 133*b*, 133*c* (described later in detail) are formed is viewed in a direction perpendicular to the surface.

On one short side continuing the case 11, a positive terminal Pt to which direct-current power on a positive side is supplied, for example, and a negative terminal Nt to which direct-current power on a negative side is supplied, for example, are placed.

On the other short side constituting the case 11, an output terminal Ot to which alternating-current power obtained by converting input direct-current power into alternating-current power by the semiconductor module 1 is output is placed. The positive terminal Pt, the negative terminal Nt, and the output terminal Ot are provided over the space 111 from case 11.

As illustrated in FIG. 1, the semiconductor module 1 includes an insulating wiring substrate 13 placed in the space 111. The insulating wiring substrate 13 is, for example, a DCB (Direct Copper Bonding) substrate or an AMB (Active Metal Brazing) substrate.

The insulating wiring substrate 13 includes the insulating substrate 131 having a rectangular flat-plate shape, for example. The insulating substrate 131 is made of ceramic such as alumina ($Al_2O_3$) or aluminum nitride (AlN), for example. The insulating wiring substrate 13 has the electrically-conductive patterns 133*a*, 133*b*, 133*c* formed on the top surface (the sealing resin 18 side (not illustrated in FIG. 1, see FIG. 2) of the insulating substrate 131. The electrically-conductive patterns 133*a*, 133*b*, 133*c* are made of copper (Cu), for example. The electrically-conductive pattern 133*a* has an oblong shape, for example. The electrically-conductive pattern 133*a* is placed near one long side of the insulating substrate 131, along the one long side. The electrically-conductive pattern 133*b* is placed to extend near the other long side of the insulating substrate 131, then extend along the short side, of the insulating substrate 131, on a side where the output terminal Ot is placed, and then extend to be directed from the short side toward a central part of the insulating substrate 131, for example. The electrically-conductive pattern 133*b* has a recessed shape, for example. The electrically-conductive pattern 133*c* is placed to extend from a central part, of the insulating substrate 131, surrounded by the electrically-conductive pattern 133*b* to a corner part, of the insulating substrate 131, on a side where the negative terminal Nt is placed, for example. The electrically-conductive pattern 133*c* has an L-shape reversed in the up-down direction, for example.

The electrically-conductive pattern 133*a* has a terminal pattern 133*a*-1 formed in an end part on a side where the positive terminal Pt is placed. An end part of the positive terminal Pt is placed in an upper part of the terminal pattern 133*a*-1. The positive terminal Pt is soldered, for example, to the terminal pattern 133*a*-1. Hereby, the positive terminal Pt is mechanically and electrically connected to the terminal pattern 133*a*-1.

The electrically-conductive pattern 133*b* has a terminal pattern 133*b*-1 formed in part of a region along the short side, of the insulating substrate 131, on a side where the output terminal Ot is placed. An end part of the output terminal Ot is placed in an upper part of the terminal pattern 133*b*-1. The output terminal Otis soldered, for example, to the terminal pattern 133*b*-1. Hereby, the output terminal Ot is mechanically and electrically connected to the terminal pattern 133*b*-1.

The electrically-conductive pattern 133*c* has a terminal pattern 133*c*-1 formed in an end part on a side where the negative terminal Nt is placed. An end part of the negative terminal Nt is placed in an upper part of the terminal pattern 133*c*-1. The negative terminal Nt is soldered, for example, to the terminal pattern 133*c*-1. Hereby, the negative terminal Nt is mechanically and electrically connected to the terminal pattern 133*c*-1.

As illustrated in FIG. 1, the semiconductor module 1 includes sintered bodies 15*a*-1, 15*a*-2 formed on the electrically-conductive pattern 133*a* and semiconductor chips 14*a*-1, 14*a*-2 placed on the sintered bodies 15*a*-1, 15*a*-2. The sintered body 15*a*-1 is formed by sintering a sintered material 151*a*-1 (not illustrated in FIG. 1, see FIG. 4 and FIG. 5), and the sintered body 15*a*-2 is formed by sintering a sintered material (not illustrated) made of the same material as the sintered material 151*a*-1. The semiconductor chip 14*a*-1 is joined to the electrically-conductive pattern 133*a* by the sintered body 15*a*-1, and the semiconductor chip 14*a*-2 is joined to the electrically-conductive pattern 133*a* by the sintered body 15*a*-2. Accordingly, the semiconductor chip 14*a*-1 is mechanically and electrically connected to the electrically-conductive pattern 133*a* by the sintered body 15*a*-1, and the semiconductor chip 14*a*-2 is mechanically and electrically connected to the electrically-conductive pattern 133*a* by the sintered body 15*a*-2.

The semiconductor module 1 includes sintered bodies 15*b*-1, 15*b*-2 formed on a region, in the electrically-conductive pattern 133*b*, along the long side of the insulating substrate 131, and semiconductor chips 14*b*-1, 14*b*-2 placed on the sintered bodies 15*b*-1, 15*b*-2. The sintered body 15*b*-1 is formed by sintering a sintered material 151*b*-1 (not illustrated in FIG. 1, see FIG. 4 and FIG. 5), and the sintered body 15*b*-2 is formed by sintering a sintered material (not illustrated) made of the same material as the sintered material 151*b*-1. The semiconductor chip 14*b*-1 is joined to the electrically-conductive pattern 133*b* by the sintered body 15*b*-1, and the semiconductor chip 14*b*-2 is joined to the electrically-conductive pattern 133*b* by the sintered body 15*b*-2. Accordingly, the semiconductor chip 14*b*-1 is mechanically and electrically connected to the electrically-conductive pattern 133*b* by the sintered body 15*b*-1, and the semiconductor chip 14*b*-2 is mechanically and electrically connected to the electrically-conductive pattern 133*b* by the sintered body 15*b*-2.

Although details are described later, in the present embodiment, in a state where spaces 61*a*, 61*b*, 61*c*, 61*d* (see FIG. 5) are provided between an upper hot plate 3 (not illustrated in FIG. 1, see FIG. 5) and the insulating substrate 131, the sintered materials 151*a*-1, 151*a*-2, 151*b*-1, 151*b*-2 (not illustrated in FIG. 1, see FIG. 4 and FIG. 5) are pressurized and heated by the upper hot plate 3 to sinter the sintered materials 151*a*-1, 151*a*-2, 151*b*-1, 151*b*-2. This accordingly makes it possible to prevent deposits caused by gas discharged from the sintered materials 151*a*-1, 151*a*-2, 151*b*-1, 151*b*-2 at the time of sintering from being attached to the semiconductor chips 14*a*-1, 14*a*-2, 14*b*-1, 14*b*-2 or the insulating substrate 131.

The sintered materials 151*a*-1, 151*a*-2, 151*b*-1, 151*b*-2 are obtained by mixing minute metallic particles coated with organic matter with an organic solvent. In a state where the sintered materials 151*a*-1, 151*a*-2, 151*b*-1, 151*b*-2 are placed between the semiconductor chips 14*a*-1, 14*a*-2, 14*b*-1, 14*b*-2 as joining targets and the electrically-conductive patterns 133*a*, 133*b*, the sintered materials 151*a*-1, 151*a*-2, 151*b*-1, 151*b*-2 are pressurized and heated, so that the organic solvent and the organic matter coating the minute metallic particles vaporize. Hereby, the minute metallic particles are exposed and fused to each other to form porous sintered bodies 15*a*-1, 15*a*-2, 15*b*-1, 15*b*-2. As the metallic particles, silver (Ag) or copper (Cu) having a particle diameter equal to or more than several nanometers but equal to or less than several micrometers are used, for example. The sintered bodies 15*a*-1, 15*a*-2, 15*b*-1, 15*b*-2 are made of, for example, a silver-based sintered material or a copper-based sintered material. These sintered materials have, for example, a thermal conductivity equal to or more than 150 W/mk but equal to or less than 400 W/mK, a coefficient of thermal expansion of about $19\times10^{-6}$/° C., and a melting point of about 960° C. Accordingly, the sintered bodies 15*a*-1, 15*a*-2, 15*b*-1, 15*b*-2 have a stable strength at an operating temperature (e.g., from 150° C. to 170° C.) of the semiconductor module 1.

As illustrated in FIG. 1, the semiconductor module 1 includes, for example, a lead frame 16*a*-1 mechanically and electrically connecting the semiconductor chip 14*a*-1 to the electrically-conductive pattern 133*b*, and a lead frame 16*a*-2 mechanically and electrically connecting the semiconductor chip 14*a*-2 to the electrically-conductive pattern 133*b*. The semiconductor module 1 includes, for example, a lead frame 16*b*-1 mechanically and electrically connecting the semiconductor chip 14*b*-1 to the electrically-conductive pattern 133*c*, and a lead frame 16*b*-2 mechanically and electrically connecting the semiconductor chip 14*b*-2 to the electrically-conductive pattern 133*c*.

On the semiconductor chips 14*a*-1, 14*a*-2, 14*b*-1, 14*b*-2, for example, a power semiconductor element (not illustrated) such as an insulated gate bipolar transistor (IGBT) or a power metal-oxide-semiconductor field-effect transistor (MOSFET) is formed. In the present embodiment, for example, an IGBT (not illustrated) is formed on each of the semiconductor chips 14*a*-1, 14*a*-2, 14*b*-1, 14*b*-2. Further, a freewheeling diode (not illustrated) connected in antiparallel to the IGBT is formed on each of the semiconductor chips 14a-1, 14a-2, 14b-1, 14b-2.

A collector terminal (not illustrated) of the IGBT and a cathode terminal (not illustrated) of the freewheeling diode, formed on the semiconductor chip 14a-1, are exposed on a surface facing the sintered body 15a-1 and are mechanically and electrically connected to the sintered body 15a-1. An emitter terminal (not illustrated) of the IGBT and an anode terminal (not illustrated) of the freewheeling diode, formed on the semiconductor chip 14a-1, are exposed on part of a surface on a side where the lead frame 16a-1 is placed and are mechanically and electrically connected to an end part of the lead frame 16a-1.

Accordingly, the IGBT and the freewheeling diode provided on the semiconductor chip 14a-1 and the IGBT and the freewheeling diode provided on the semiconductor chip 14a-2 are connected in parallel by the electrically-conductive pattern 133a, the lead frames 16a-1, 16a-2, and the electrically-conductive pattern 133b, between the positive terminal Pt and the output terminal Ot.

A collector terminal (not illustrated) of the IGBT and a cathode terminal (not illustrated) of the freewheeling diode, formed on the semiconductor chip 14a-2, are exposed on a surface facing the sintered body 15a-2 and are mechanically and electrically connected to the sintered body 15a-2. An emitter terminal (not illustrated) of the IGBT and an anode terminal (not illustrated) of the freewheeling diode, formed on the semiconductor chip 14a-2, are exposed on part of a surface on a side where the lead frame 16a-2 is placed and are mechanically and electrically connected to an end part of the lead frame 16a-2.

A collector terminal (not illustrated) of the IGBT and a cathode terminal (not illustrated) of the freewheeling diode, formed on the semiconductor chip 14b-1, are exposed on a surface facing the sintered body 15b-1 and are mechanically and electrically connected to the sintered body 15b-1. An emitter terminal (not illustrated) of the IGBT and an anode terminal (not illustrated) of the freewheeling diode, formed on the semiconductor chip 14b-1, are exposed on part of a surface on a side where the lead frame 16b-1 is placed and are mechanically and electrically connected to an end part of the lead frame 16b-1.

A collector terminal (not illustrated) of the IGBT and a cathode terminal (not illustrated) of the freewheeling diode, formed on the semiconductor chip 14b-2, are exposed on a surface facing the sintered body 15b-2 and are mechanically and electrically connected to the sintered body 15b-2. An emitter terminal (not illustrated) of the IGBT and an anode terminal (not illustrated) of the freewheeling diode, formed on the semiconductor chip 14b-2, are exposed on part of a surface on a side where the lead frame 16b-2 is placed and are mechanically and electrically connected to an end part of the lead frame 16b-2.

Accordingly, the IGBT and the freewheeling diode provided on the semiconductor chip 14b-1 are connected in parallel to the IGBT and the freewheeling diode provided on the semiconductor chip 14b-2 by the electrically-conductive pattern 133b, the lead frames 16b-1, 16b-2, and the electrically-conductive pattern 133c, between the output terminal Ot and the negative terminal Nt. Further, the IGBTS and the freewheeling diodes provided on the semiconductor chips 14a-1, 14a-2 to be connected in parallel to each other are connected in series to the IGBTS and the freewheeling diodes provided on the semiconductor chips 14b-1, 14b-2 to be connected in parallel to each other, by the electrically-conductive pattern 133a, the lead frames 16a-1, 16a-2, the electrically-conductive pattern 133b, the lead frames 16b-1, 16b-2, and the electrically-conductive pattern 133c, between the positive terminal Pt and the negative terminal Nt.

Gate terminals of the IGBTS are exposed on another part of respective surfaces, of the semiconductor chips 14a-1, 14a-2, 14b-1, 14b-2, where the emitter terminals of the IGBTS and the anode terminals of the freewheeling diodes on the semiconductor chips 14a-1, 14a-2, 14b-1, 14b-2 are exposed. The gate terminals are connected to different terminals among a plurality of terminals (not illustrated) provided in the case 11, by lead frames or bonding wires (not illustrated). A control device (not illustrated) configured to generate control signals for controlling the semiconductor chips 14a-1, 14a-1, 14b-1, 14b-2 are connected to the terminals thus provided in the case 11. Accordingly, the IGBTS provided on the semiconductor chips 14a-1, 14a-2, 14b-1, 14b-2 are controlled to be on/off at a predetermined timing in response to respective gate signals input from the control device via the terminals provided in the case 11. Hereby, the semiconductor chips 14a-1, 14a-2, 14b-1, 14b-2 collaborate and convert direct-current power input from the positive terminal Pt and the negative terminal Nt into alternating-current power. The semiconductor module 1 outputs, from the output terminal Ot, the alternating-current power generated by the semiconductor chips 14a-1, 14a-2, 14b-1, 14b-2 and drives a load (not illustrated)(e.g., a motor) connected to the output terminal Ot.

As illustrated in FIG. 2, the insulating wiring substrate 13 includes a heat transfer member 135 having a rectangular flat-plate shape and formed on a surface, of the insulating substrate 131, opposite to the surface where the electrically-conductive patterns 133a, 133b, 133c are formed. The heat transfer member 135 is formed on generally the whole surface of the insulating substrate 131, for example. The heat transfer member 135 is made of copper, for example.

As illustrated in FIG. 2, the semiconductor module 1 includes a cooler 19 attached to the case 11. The heat transfer member 135 is connected to the cooler 19 by soldering, for example. Heat generated at the time when the IGBTS formed on the semiconductor chips 14a-1, 14a-2, 14b-1, 14b-2 work is dissipated to outside via the heat transfer member 135 and the cooler 19. Hereby, the semiconductor module 1 can prevent the IGBTS formed on the semiconductor chips 14a-1, 14a-2, 14b-1, 14b-2 from losing control due to the heat.

As illustrated in FIG. 2, the semiconductor module 1 includes the sealing resin 18 formed in the space 111 to cover generally the whole surface of the insulating substrate 131, including the electrically-conductive patterns 133a, 133b, 133c, the sintered bodies 15a-1, 15a-2, 15b-1, 15b-2, the semiconductor chips 14a-1, 14a-2, 14b-1, 14b-2, and the lead frames 16a-1, 16a-2, 16b-1, 16b-2. The sealing resin 18 is made of a material such as epoxy resin different from the case 11, for example. The sealing resin 18 is a seal member sealing constituents such as the semiconductor chips 14a-1, 14a-2, 14b-1, 14b-2 and the insulating wiring substrate 13 provided in the space 111. The sealing resin 18 seals the insulating substrate 131 to improve the insulating property between the electrically-conductive patterns 133a, 133b, 133c formed on the insulating substrate 131. Hereby, the sealing resin 18 can improve the reliability of the semiconductor module 1.

In FIG. 1, four semiconductor chips 14a-1, 14a-2, 14b-1, 14b-2 are placed on the insulating wiring substrate 13, but the number of semiconductor chips to be placed on the insulating wiring substrate 13 and the number and the shape of the electrically-conductive patterns 133a, 133b, 133c to be formed in the insulating wiring substrate 13 are not limited to the numbers and so on illustrated in FIG. 1. Further, in FIG. 1, one insulating wiring substrate 13 is placed in the case 11, but the number of the insulating wiring substrates 13 is not limited to one. The semiconductor module 1 may include a plurality of insulating wiring substrates provided in the case 11, for example, and is applicable to a three-phase power conversion module, for example.

(Manufacturing Method of Semiconductor Module)

Next, a method of manufacturing a semiconductor module according to the present embodiment will be described with reference to FIG. 3 to FIG. 6. The description of the method of manufacturing the semiconductor module according to the present embodiment will be made with reference to a manufacturing method of the semiconductor module 1 illustrated in FIG. 1 and FIG. 2, as an example. FIG. 2 illustrates an example of the flow of a step (hereinafter also referred to as a "joining step") of joining the semiconductor chips 14*a*-1, 14*a*-2, 14*b*-1, 14*b*-2 to the insulating wiring substrate 13 in the method of manufacturing the semiconductor module according to the present embodiment.

Figure 3:
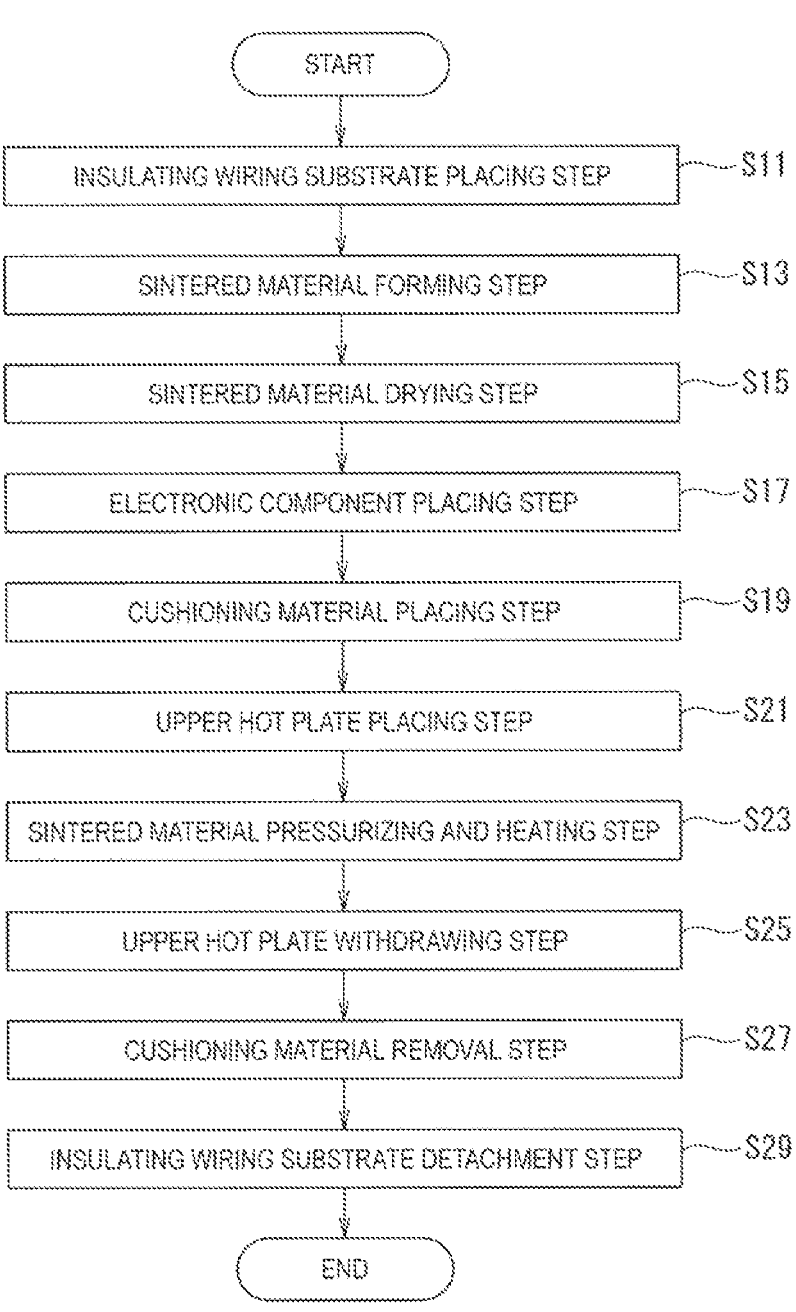
FIG. 3 is a flowchart illustrating an example of a flow of the method of manufacturing the semiconductor module according to the first embodiment of the present invention.
Figure 4:
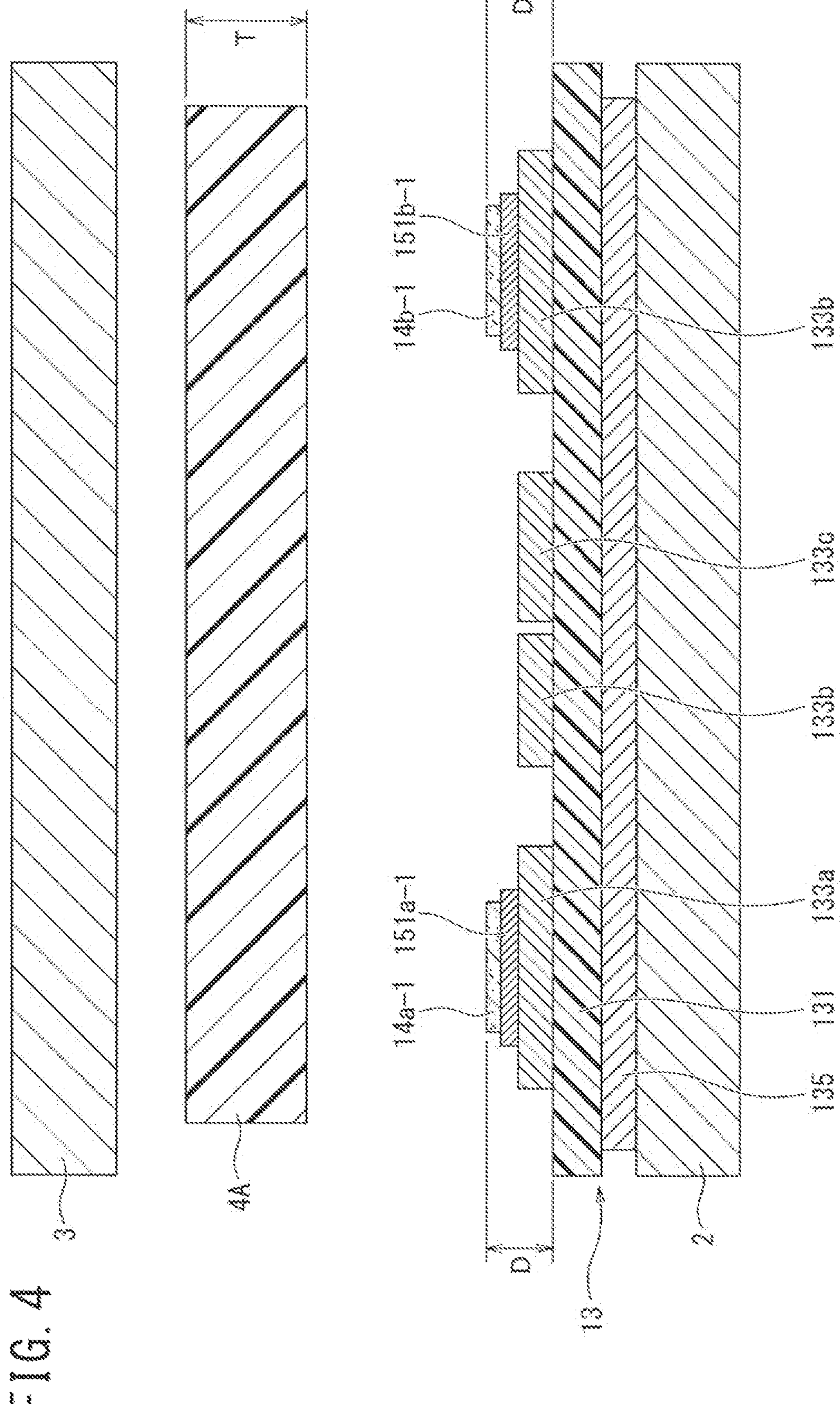
FIG. 4 is a view schematically illustrating steps from an insulating wiring substrate placing step to an upper hot plate placing step in the method of manufacturing the semiconductor module according to the first embodiment of the present invention.

As illustrated in FIG. 3, in step S11 in the joining step in the manufacturing method of the semiconductor module 1 according to the present embodiment, a placing step of placing the insulating wiring substrate 13 is performed. More specifically, in step S11, the insulating wiring substrate 13 in which the electrically-conductive patterns 133*a*, 133*b*, 133*c* are formed on the insulating substrate 131 is placed on a lower hot plate 2, as illustrated in FIG. 4. The lower hot plate 2 has a flat-plate shape, for example. The lower hot plate 2 is made of a metallic material for a metal mold, for example. Note that the lower hot plate 2 may be made of a ceramics material (e.g., silicon nitride or aluminum nitride). The lower hot plate 2 is attached to a manufacturing apparatus for the semiconductor module 1. In order to apply heat to the sintered materials in a later step, the lower hot plate 2 may be heated and attached to the manufacturing apparatus before the insulating wiring substrate 13 is placed. Further, the lower hot plate 2 may be heated by the manufacturing apparatus before the insulating wiring substrate 13 is placed or after the insulating wiring substrate 13 is placed. Further, the lower hot plate 2 may be heated by the manufacturing apparatus after a sintered material drying step (described later in detail). The lower hot plate 2 is heated from 200° C. to 350° C. (in the present embodiment, 250° C.), for example.

In step S13 subsequent to step S11, a sintered material forming step is performed. More specifically, in step S13, as illustrated in FIG. 4, the sintered materials 151*a*-1, 151*b*-1, a sintered material (not illustrated) to form the sintered body 15*b*-2 (see FIG. 1), and a sintered material (not illustrated) to form the sintered body 15*a*-2 (see FIG. 1) are placed on the electrically-conductive patterns 133*a*. 133*b*. The sintered material 151*a*-1 and the sintered material to form the sintered body 15*a*-2 are applied to respective predetermined positions on the electrically-conductive pattern 133*a* and formed by paste printing or a dispenser. The sintered material 151*b*-1 and the sintered material to form the sintered body 15*b*-2 are applied to respective predetermined positions on the electrically-conductive pattern 133*b* and formed by paste printing. Hereinafter, for purposes of this description, the sintered material to form the sintered body 15*a*-2 is referred to as the "sintered material 151*a*-2," and the sintered material to form the sintered body 15*b*-2 is referred to as the "sintered material 151*b*-2," although not illustrated herein.

In step S15 subsequent to step S13, the sintered material drying step is performed. More specifically, in step S15, all sintered materials formed on the electrically-conductive pattern 133*a*, including the sintered material 151*a*-1, and all sintered materials formed on the electrically-conductive pattern 133*b*, including the sintered material 151*b*-1, are pasted and dried at a temperature from 100° C. to 150° C., for example. By drying all the sintered materials formed on the electrically-conductive patterns 133*a*, 133*b* in the sintered material drying step, it is possible to prevent dirt from being generated from the sintered materials in a subsequent sintered material pressurizing and heating step (described later in detail). Note that the sintered material drying step may be omitted. Hereby, it is possible to achieve a reduction in the manufacturing cost of the semiconductor module.

In step S17 subsequent to step S15, an electronic component placing step is performed. More specifically, in step S17, electronic components are placed on the sintered materials 151*a*-1, 151*b*-1. In the present embodiment, the electronic components are the semiconductor chips 14*a*-1, 14*b*-1. The semiconductor chip 14*a*-1 is placed on the sintered material 151*a*-1 such that the semiconductor chip 14*a*-1 makes contact with the sintered material 151*a-i*. The semiconductor chip 14*a*-2 (see FIG. 1) is placed on the sintered material 151*a*-2 such that the semiconductor chip 14*a*-2 makes contact with the sintered material 151*a*-2. The semiconductor chip 14*b*-1 is placed on the sintered material 151*b*-1 such that the semiconductor chip 14*b*-1 makes contact with the sintered material 151*b*-1. The semiconductor chip 14*b*-2 (see FIG. 1) is placed on the sintered material 151*b*-2 such that the semiconductor chip 14*b*-2 makes contact with the sintered material 151*b*-2. A distance D from the insulating substrate 131 to the surfaces, of the semiconductor chips 14*a*-1, 14*a*-2, 14*b*-1, 14*b*-2, on a cushioning material 4A side (described later in detail) is 0.52 mm, for example. More specifically, the electrically-conductive patterns 133*a*, 133*b*, 133*c* have a thickness of 0.4 mm, for example, and the semiconductor chips 14*a*-1, 14*a*-2, 14*b*-1, 14*b*-2 have a thickness of 0.1 mm, for example.

In step S19 subsequent to step S17, a cushioning material placing step is performed. More specifically, in step S19, as illustrated in FIG. 4, the cushioning material 4A is placed over the semiconductor chips 14*a*-1, 14*a*-2, 14*b*-1, 14*b*-2. In the present embodiment, one cushioning material 4A having a size that can cover the whole surface of the insulating substrate 131, including the semiconductor chips 14*a*-1, 14*a*-2, 14*b*-1, 14*b*-2 is placed. Accordingly, the cushioning material 4A is also placed on the sintered materials 151*a*-1, 151*a*-2, 151*b*-1, 151*b*-2 and the electrically-conductive patterns 133*a*, 133*b*, 133*c*. The cushioning material 4A is constituted by a carbon sheet or the like having a low elastic module even at the time of sintering of the sintered materials 151*a*-1, 151*a*-2, 151*b*-1, 151*b*-2, for example. The cushioning material 4A has a heat-resisting property to at least a temperature (in the present embodiment, 250° C.) applied to the sintered materials 151*a*-1, 151*a*-2, 151*b*-1, 151*b*-2 at the time of sintering. Further, the cushioning material 4A has a thickness T (e.g., T=0.6 mm) before the sintered materials 151*a*-1, 151*a*-2, 151*b*-1, 151*b*-2 are pressurized.

In step S21 subsequent to step S19, an upper hot plate placing step is performed. More specifically, in step S21, as illustrated in FIG. 4, the upper hot plate 3 is placed on the cushioning material 4A. The upper hot plate 3 has a flat plate shape and is one size larger than the cushioning material 4A. Hereby, at the time of sintering the sintered materials 151*a*-1, 151*a*-2, 151*b*-1, 151*b*-2, the upper hot plate 3 can apply generally uniform force to the whole surface of the cushioning material 4A. The upper hot plate 3 is made of the same metallic material as the lower hot plate 2, for example. The upper hot plate 3 may be made of a ceramics material (e.g., silicon nitride or aluminum nitride). Further, the upper hot plate 3 may be made of a material different from that of the lower hot plate 2, for example.

The upper hot plate 3 is attached to the manufacturing apparatus for the semiconductor module 1. In order to apply heat to the sintered materials in a later step, the upper hot plate 3 may be heated and attached to the manufacturing apparatus before the upper hot plate 3 is paced on the cushioning material 4A. Alternatively, the upper hot plate 3 may be heated by the manufacturing apparatus before the upper hot plate 3 is placed on the cushioning material 4A or after the upper hot plate 3 is placed on the cushioning material 4A. The upper hot plate 3 is heated from 200° C. to 350° C. (in the present embodiment, 250° C.), for example. The upper hot plate 3 may be heated to reach the same temperature as the lower hot plate 2 or may be heated to reach a temperature different from that of the lower hot plate 2, provided that the sintered materials 151*a*-1, 151*a*-2, 151*b*-1, 151*b*-2 can be sintered at that temperature.

Figure 5:
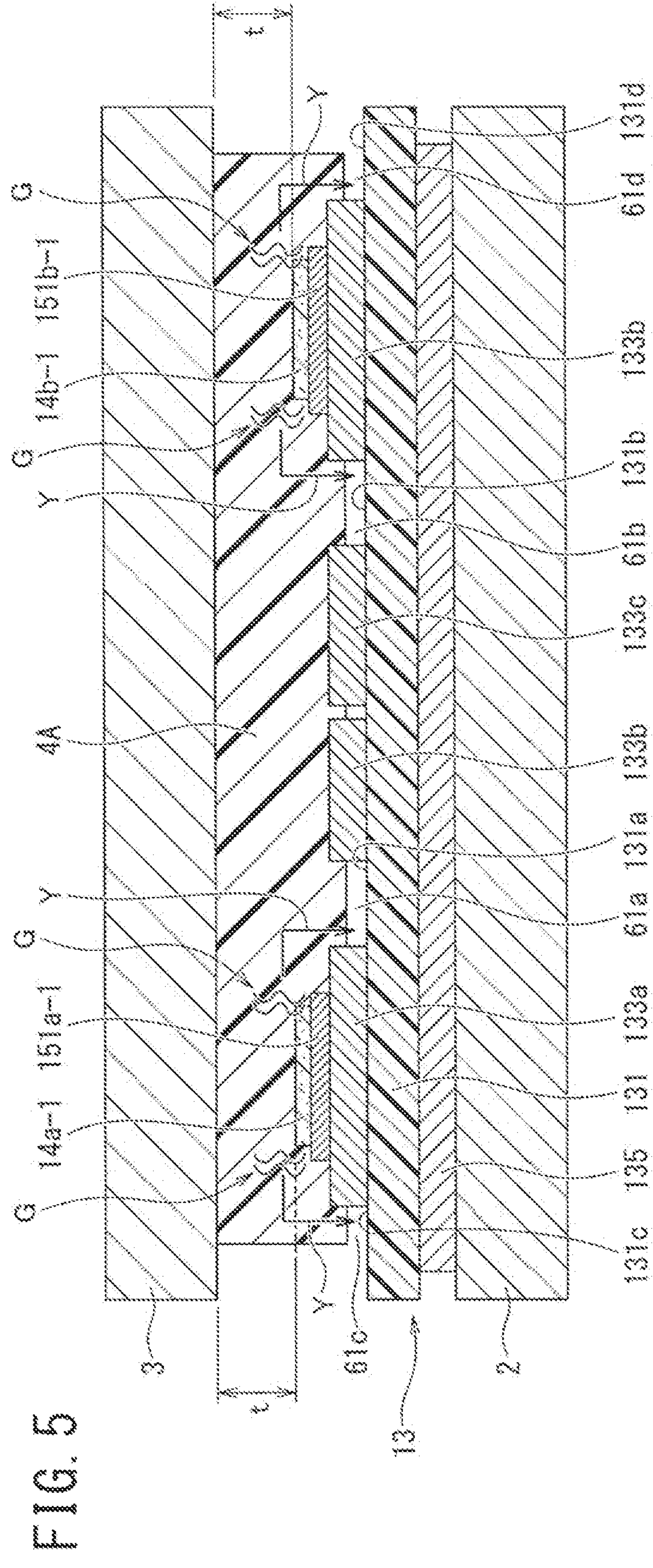
FIG. 5 is a view schematically illustrating a sintered material pressurizing and heating step in the method of manufacturing the semiconductor module according to the first embodiment of the present invention.

In step S23 subsequent to step S21, a sintered material pressurizing and heating step is performed. More specifically, in step S23, as illustrated in FIG. 5, the sintered materials 151*a*-1, 151*a*-2, 151*b*-1, 151*b*-2 are sintered by being pressurized and heated via the cushioning material 4A and the semiconductor chips 14*a*-1, 14*a*-2, 14*b*-1, 14*b*-2 by the upper hot plate 3 in a state where spaces 61*a*, 61*b*, 61*c*, 61*d* are provided between the cushioning material 4A and parts 131*a*, 131*b*, 131*c*, 131*d* of the insulating substrate 131.

The cushioning material 4A is softer than the semiconductor chips 14*a*-1, 14*a*-2, 14*b*-1, 14*b*-2, the sintered materials 151*a*-1, 151*a*-2, 151*b*-1, 151*b*-2, and the electrically-conductive patterns 133*a*, 133*b*, 133*c*. Because of this, as illustrated in FIG. 5, force directed toward the semiconductor chips 14*a*-1, 14*a*-2, 14*b*-1, 14*b*-2, the sintered materials 151*a*-1, 151*a*-2, 151*b*-1, 151*b*-2, and the electrically-conductive patterns 133*a*, 133*b*. 133*c* is assumed to be applied to the cushioning material 4A from the upper hot plate 3. This causes the cushioning material 4A to be pushed up toward the upper hot plate 3 by the semiconductor chips 14*a*-1, 14*a*-2, 14*b*-1, 14*b*-2, the sintered materials 151*a*-1, 151*a*-2, 151*b*-1, 151*b*-2, and the electrically-conductive patterns 133*a*, 133*b*, 133*c*. Hereby, a surface, of the cushioning material 4A, on the lower hot plate 2 side has a shape following a stepped shape formed by the semiconductor chips 14*a*-1, 14*a*-2, 14*b*-1, 14*b*-2, the sintered materials 151*a*-1, 151*a*-2, 151*b*-1, 151*b*-2, and the electrically-conductive patterns 133*a*. 133*b*, 133*c*. The cushioning material 4A is compressed in a state where the surface, of the cushioning material 4A, on the lower hot plate 2 side is deformed as such at the time of sintering of the sintered materials 151*a*-1, 151*a*-2, 151*b*-1, 151*b*-2.

The sintered materials 151*a*-1, 151*a*-2, 151*b*-1, 151*b*-2 are pressurized by the upper hot plate 3 so that the amount of change in the thickness of the cushioning material 4A on the semiconductor chips 14*a*-1, 14*a*-2, 14*b*-1, 14*b*-2 before and after the pressurization of the sintered materials 151*a*-1, 151*a*-2, 151*b*-1, 151*b*-2 is smaller than the distance from the insulating substrate 131 to the surfaces, on the cushioning material 4A side, of the semiconductor chips 14*a*-1, 14*a*-2, 14*b*-1, 14*b*-2. The thickness of the cushioning material 4A before the pressurization of the sintered materials 151*a*-1, 151*a*-2, 151*b*-1, 151*b*-2 is indicated by T (see FIG. 4), and the thickness of the cushioning material 4A after the pressurization of the sintered materials 151*a*-1, 151*a*-2, 151*b*-1, 151*b*-2 is indicated by t. In this case, the relationship of Formula (1) described below is established between the amount of change T−t and the distance D from the insulating substrate 131 to the surfaces of the semiconductor chips 14*a*-1, 14*a*-2, 14*b*-1, 14*b*-2.

$$T-t<D \tag{1}$$

In a case where respective distances from the insulating substrate 131 to the surfaces, on the cushioning material 4A side, of the semiconductor chips 14*a*-1, 14*a*-2, 14*b*-1, 14*b*-2 are different from each other due to the semiconductor chips 14*a*-1, 14*a*-2, 14*b*-1, 14*b*-2 having different thicknesses or the like, the surface of a semiconductor chip having a longest distance from the insulating substrate 131 is targeted for the distance D. Further, in a case where the surface of the semiconductor chip targeted for the distance D has irregularities, a part most distant from the insulating substrate 131 among the irregularities is targeted for the distance D. In other words, in a case where respective distances from the insulating substrate 131 to the surfaces, on the cushioning material 4A side, of the semiconductor chips 14*a*-1, 14*a*-2, 14*b*-1, 14*b*-2 are different from each other due to the semiconductor chips 14*a*-1, 14*a*-2, 14*b*-1, 14*b*-2 having different thicknesses or the like, the surface of a semiconductor chip having a shortest distance from the surface, of the cushioning material 4A, facing the lower hot plate 2 side is targeted for the distance D. Further, in a case where the surface of the semiconductor chip targeted for the distance D has irregularities, a part closest to the surface, of the cushioning material 4A, facing the lower hot plate 2 side among the irregularities is targeted for the distance D.

In the present embodiment, one cushioning material 4A is used. Accordingly, the sintered materials 151*a*-1, 151*a*-2, 151*b*-1, 151*b*-2 are pressurized and heated in a state where the one cushioning material 4A is brought into contact with each of the electrically-conductive patterns 133*a*, 133*b*, 133*c*, the sintered materials 151*a*-1, 151*a*-2, 151*b*-1, 151*b*-2, and the semiconductor chips 141*a*-1, 14*a*-2, 14*b*-1, 14*b*-2. Further, the sintered materials 151*a*-1, 151*a*-2, 151*b*-1, 151*b*-2 are pressurized by the upper hot plate 3 to satisfy Formula (1). That is, the sintered materials 151*a*-1, 151*a*-2, 151*b*-1, 151*b*-2 are pressurized with the cushioning material 4A making no contact with the parts 131*a*. 131*b*, 131*c*, 131*d* of the insulating substrate 131. Hereby, the spaces 61*a*, 61*b*, 61*c*, 61*d* are provided between the cushioning material 4A and the insulating substrate 131.

As described above, in the present embodiment, the thickness t of the cushioning material 4A after the pressurization of the sintered materials 151*a*-1, 151*a*-2, 151*b*-1, 151*b*-2 is 0.3 mm, for example. The thickness T of the cushioning material 4A before the pressurization of the sintered materials 151*a*-1, 151*a*-2, 151*b*-1, 151*b*-2 is 0.6 mm, for example. The distance D from the insulating substrate 131 to the surfaces of the semiconductor chips 14*a*-1, 14*a*-2, 14*b*-1, 14*b*-2 is 0.52 mm, for example. Accordingly, the amount of change T−t in the thickness of the cushioning material 4A before and after the pressurization of the sintered materials 151*a*-1, 151*a*-2, 151*b*-1, 151*b*-2 is 0.3 mm and is smaller than the distance D. Thus, in the method of manufacturing the semiconductor module according to the present embodiment, the relationship of Formula (1) is established.

In the present embodiment, the space 61*a* is a region surrounded by the electrically-conductive pattern 133*a*, the insulating substrate 131, the electrically-conductive pattern 133*b*, and the cushioning material 4A. The space 61*b* is a region surrounded by the electrically-conductive pattern 133*c*, the insulating substrate 131, the electrically-conductive pattern 133*b*, and the cushioning material 4A. The space 61*c* is a region surrounded by the insulating substrate 131, the electrically-conductive pattern 133*a*, and the cushioning material 4A. The space 61*c* is a region surrounded by the insulating substrate 131, the electrically-conductive pattern 133*b*, and the cushioning material 4A.

When the sintered materials 151*a*-1, 151*a*-2, 151*b*-1, 151*b*-2 are pressurized and heated in a state where the spaces 61*a*, 61*b*, 61*c*, 61*d* are formed, gas G discharged from the sintered materials 151*a*-1, 151*a*-2, 151*b*-1, 151*b*-2 passes through the spaces 61*a*, 61*b*, 61*c*, 61*d* to be discharged to outside a region sandwiched between the lower hot plate 2 and the upper hot plate 3, as indicated by arrows Y in FIG. 5. As a result, although details are described later, it is possible to prevent deposits caused by the gas G from being generated on the surface of the insulating substrate 131, and the like after the joining step.

In the sintered material pressurizing and heating step, the lower hot plate 2 supports the insulating wiring substrate 13 from the heat transfer member 135 side in a state where the insulating wiring substrate 13 is fixed. Further, the lower hot plate 2 has a temperature of 250° C. or more, for example. Accordingly, in the sintered material pressurizing and heating step, the lower hot plate 2 pressurizes and heats the sintered materials 151*a*-1, 151*a*-2, 151*b*-1, 151*b*-2 via the insulating wiring substrate 13. Thus, the sintered materials 151*a*-1, 151*a*-2, 151*b*-1, 151*b*-2 are sintered by receiving, from the upper hot plate 3 and the lower hot plate 2, a pressure equal to or more than 1 MPa but equal to or less than 50 MPa and a temperature equal to or more than 200° C. but equal to or less than 300° C. during a period equal to or more than 60 seconds but equal to or less than 300 seconds, for example.

Figure 6:
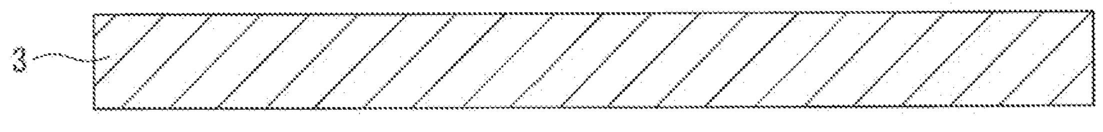
FIG. 6 is a view schematically illustrating steps from an upper hot plate withdrawing step to an insulating wiring substrate detachment step in the method of manufacturing the semiconductor module according to the first embodiment of the present invention.
Figure 6:
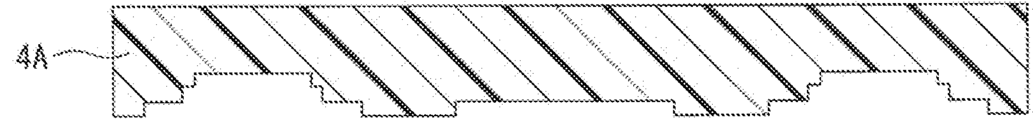
Figure 6:
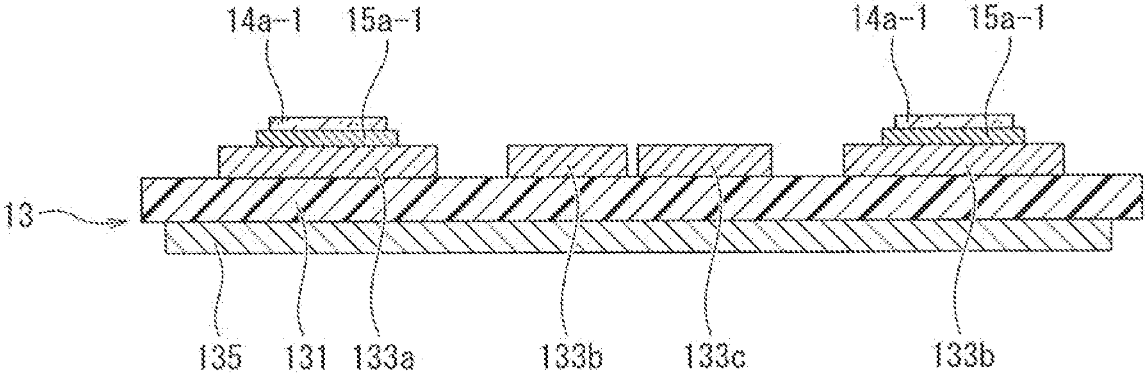
Figure 6:

In step S25 subsequent to step S23, an upper hot plate withdrawing step is performed. More specifically, in step S25, as illustrated in FIG. 6, the upper hot plate 3 is withdrawn upward from the lower hot plate 2 to be separated from the cushioning material 4A, for example.

In step S27 subsequent to step S25, a cushioning material removal step is performed. More specifically, in step S27, as illustrated in FIG. 6, the cushioning material 4A is removed from the insulating wiring substrate 13. On the surface, on the lower hot plate 2 side, of the cushioning material 4A, shapes following the semiconductor chips 14*a*-1, 14*a*-2, 14*b*-1, 14*b*-2, the sintered materials 151*a*-1, 151*a*-2, 151*b*-1, 151*b*-2, and the electrically-conductive patterns 133*a*, 133*b*. 133*c* remain. Because of this, the cushioning material 4A is a disposable member replaced every time when the semiconductor module 1 is manufactured.

In step S29 subsequent to step S27, an insulating wiring substrate detachment step is performed. More specifically, in step S29, as illustrated in FIG. 6, the insulating wiring substrate 13 including the semiconductor chips 14*a*-1, 14*a*-2, 14*b*-1, 14*b*-2 joined to the electrically-conductive patterns 133*a*, 133*b* by the sintered bodies 15*a*-1, 15*a*-2, 15*b*-1, 15*b*-2 is detached from the lower hot plate 2. Hereby, the joining step of joining the semiconductor chips 14*a*-1, 14*a*-2, 14*b*-1, 14*b*-2 to the insulating wiring substrate 13 is ended.

Although not illustrated herein, the semiconductor chips 14*a*-1, 14*a*-2, 14*b*-1, 14*b*-2 are joined to the electrically-conductive pattern 133*c* via the lead frames 16*a*-1, 16*a*-2, 16*b*-1, 16*b*-2 by soldering or the like (see FIG. 1). Subsequently, the heat transfer member 135 provided on the insulating wiring substrate 13 is joined to the cooler 19 by soldering or the like, for example. Subsequently, the cooler 19 is bonded to the case 11 by adhesive, for example, to be attached thereto in a state where the insulating wiring substrate 13 is placed in the space 111 of the case 11 (see FIG. 2). Subsequently, the positive terminal Pt is connected to the terminal pattern 133*a*-1, the negative terminal Nt is connected to the terminal pattern 133*b*-1, and the output terminal Ot is connected to the terminal pattern 133*c*-1. Subsequently, respective gate terminals exposed on respective surfaces of the semiconductor chips 14*a*-1, 14*a*-2, 14*b*-1, 14*b*-2 are connected to terminals placed in the case 11 by lead frames, for example. Subsequently, the sealing resin 18 is cast into the space 111 to cover the semiconductor chips 14*a*-1, 14*a*-2, 14*b*-1, 14*b*-2, the lead frames 16*a*-1, 16*a*-2, 16*b*-1, 16*b*-2, the other lead frames, and the electrically-conductive patterns 133*a*, 133*b*, 133*c*. Hereby, the semiconductor module 1 is completed.

(Effects of Method of Manufacturing Semiconductor Module)

Next, effects of the method of manufacturing the semiconductor module according to the present embodiment will be described with reference to FIG. 4 and FIG. 5 and also FIG. 6 to FIG. 8.

Comparative Example

Figure 7:
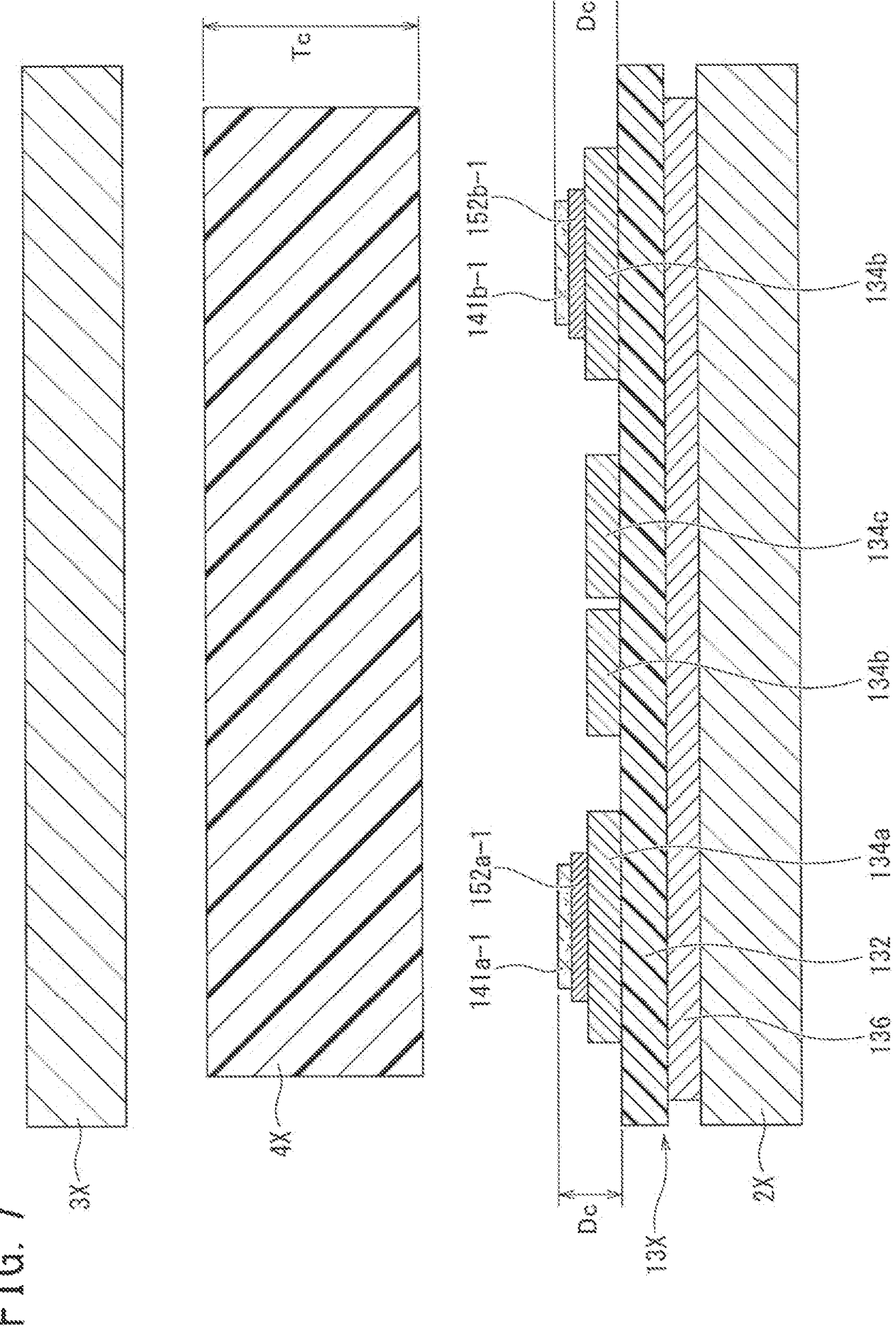
FIG. 7 is a view schematically illustrating an upper hot plate placing step in a method of manufacturing a semiconductor module of a comparative example.

FIG. 6 and FIG. 7 are views to describe a sintered material pressurizing and heating step in a method of manufacturing a semiconductor module of a comparative example.

As illustrated in FIG. 7, in the method of manufacturing the semiconductor module of the comparative example, an insulating wiring substrate 13X is placed on a lower hot plate 2X having a flat plate shape, similarly to the present embodiment. Similarly to the insulating wiring substrate 13 in the present embodiment, the insulating wiring substrate 13X includes an insulating substrate 132, electrically-conductive patterns 134*a*. 134*b*, 134*c* formed on one surface of the insulating substrate 132, and a heat transfer member 136 formed on the other surface of the insulating substrate 132. The insulating substrate 132 has actions and functions similar to those of the insulating substrate 131 in the present embodiment. The electrically-conductive patterns 134*a*, 134*b*, 134*c* have actions and functions similar to those of the electrically-conductive patterns 133*a*, 133*b*, 133*c* in the present embodiment. The heat transfer member 136 has actions and functions similar to those of the heat transfer member 135 in the present embodiment. The insulating wiring substrate 13X is placed on the lower hot plate 2X such that the heat transfer member 136 faces the lower hot plate 2X side.

Subsequently, as illustrated in FIG. 7, sintered materials 152*a*-1, 152*b*-1 are formed by paste printing in respective predetermined parts of the electrically-conductive patterns 134*a*, 134*b*, and after that, the sintered materials 152*a*-1, 152*b*-1 are subjected to paste drying. The sintered materials 152*a*-1, 152*b*-1 have actions and functions similar to those of the sintered materials 151*a*-1, 151*b*-1 in the present embodiment. In the method of manufacturing the semiconductor module of the comparative example, similarly to the method of manufacturing the semiconductor module according to the present embodiment, sintered materials corresponding to the sintered materials 151*a*-2, 151*b*-2 are also formed, but these sintered materials are not described herein.

Subsequently, as illustrated in FIG. 7, the semiconductor chips 141*a*-1, 141*b*-1 are placed on the sintered materials 152*a*-1, 152*b*-1. The semiconductor chips 141*a*-1, 141*b*-1 have actions and functions similar to those of the semiconductor chips 14*a*-1, 14*b*-1 in the present embodiment. In the method of manufacturing the semiconductor module of the comparative example, similarly to the method of manufacturing the semiconductor module according to the present embodiment, semiconductor chips corresponding to the semiconductor chips 14*a*-2, 14*b*-2 are also placed on the sintered materials corresponding to the sintered materials 151*a*-2, 151*b*-2 in the present embodiment, but these semiconductor chips are not described herein. A distance Dc from the insulating substrate 132 to the surfaces, of the semiconductor chips 141*a*-1, 14*b*-1, on a cushioning material 4X side (described later in detail) is 0.52 mm, for example, similarly to the present embodiment. More specifically, the electrically-conductive patterns 134*a*, 134*b*, 134*c* has a thickness of 0.4 mm, for example, and the semiconductor chip 141*a*-1, 141*b*-1 has a thickness of 0.1 mm.

Subsequently, as illustrated in FIG. 7, the cushioning material 4X is placed over the semiconductor chips 141*a*-1, 141*b*-1. In the comparative example, one cushioning material 4X having a size that can cover the whole surface of the insulating substrate 132, including the semiconductor chips 141*a*-1, 141*b*-1, is placed. The cushioning material 4X in the comparative example is made of the same material as the cushioning material 4A in the present embodiment, for example, but the cushioning material 4X has a thickness different from that of the cushioning material 4A. The cushioning material 4X has a thickness of 1.6 mm, for example. Thus, the cushioning material 4X is formed to be thicker than the cushioning material 4A.

Subsequently, as illustrated in FIG. 7, an upper hot plate 3X is placed on the cushioning material 4X. The upper hot plate 3X has a flat plate shape and is one size larger than the cushioning material 4X. Hereby, at the time of sintering the sintered materials 152*a*-1, 152*b*-1, the upper hot plate 3X can apply generally uniform force to the whole surface of the cushioning material 4X. The cushioning material 4X is made of a material similar to that of the cushioning material 4A and heated to a temperature similar to that of the cushioning material 4A, for example.

Figure 8:
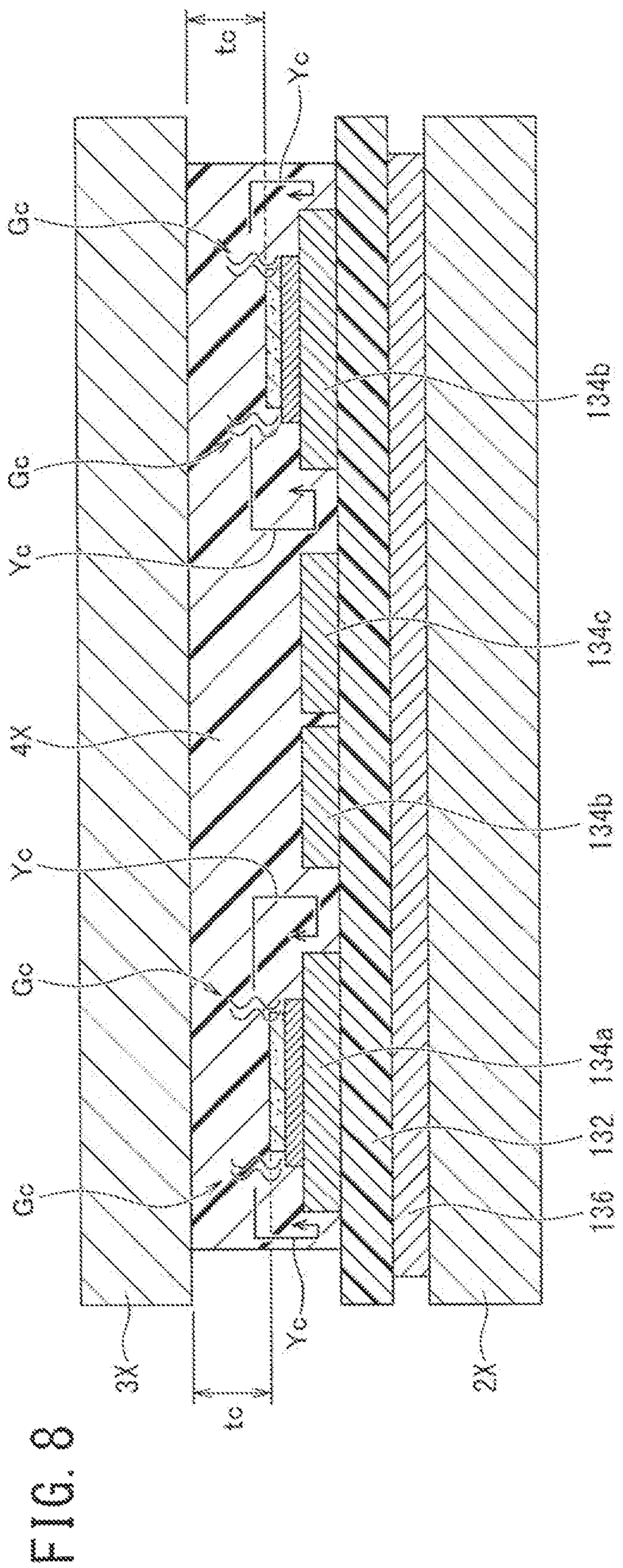
FIG. 8 is a view schematically illustrating a sintered material pressurizing and heating step in the method of manufacturing the semiconductor module of the comparative example.

Subsequently, as illustrated in FIG. 8, in a state where the cushioning material 4X is brought into contact with the semiconductor chips 141*a*-1, 141*b*-1, the sintered materials 152*a*-1, 152*b*-1, and the insulating substrate 132, the sintered materials 152*a*-1, 152*b*-1 are sintered by being pressurized and heated by the upper hot plate 3X. The sintered materials 152*a*-1, 152*b*-1 are pressurized and heated by the upper hot plate 3X via the cushioning material 4X and the semiconductor chips 141*a*-1, 141*b*-1.

The cushioning material 4X is softer than the semiconductor chips 141*a*-1, 141*b*-1, the sintered materials 152*a*-1, 152*b*-1, and the electrically-conductive patterns 134*a*, 134*b*, 134*c*. Accordingly, force directed toward the semiconductor chips 141*a*-1, 141*b*-1, the sintered materials 152*a*-1, 152*b*-1, and the electrically-conductive patterns 134*a*, 134*b*, 134*c* is assumed to be applied to the cushioning material 4X from the upper hot plate 3X. In this case, as illustrated in FIG. 8, the cushioning material 4X is pushed up toward the upper hot plate 3X by the semiconductor chips 141*a*-1, 141*b*-1, the sintered materials 152*a*-1, 152*b*-1, and the electrically-conductive patterns 134*a*, 134*b*, 134*c*. Hereby, the surface, on the lower hot plate 2X side, of the cushioning material 4X has a shape following a stepped shape formed by the semiconductor chips 141*a*-1, 141*b*-1, the sintered materials 152*a*-1, 152*b*-1, and the electrically-conductive patterns 134*a*, 134*b*, 134*c*. The cushioning material 4X is compressed in a state where the surface, on the lower hot plate 2X side, of the cushioning material 4X is deformed as such at the time of sintering of the sintered materials 152*a*-1, 152*b*-1.

As illustrated in FIG. 8, a thickness tc of the cushioning material 4X after the pressurization of the sintered materials 152*a*-1, 152*b*-1 is 0.8 mm, for example. As described above, a thickness Tc of the cushioning material 4X before the pressurization of the sintered materials 152*a*-1, 152*b*-1 is 1.6 mm, for example. On this account, in the comparative example, the amount of change Tc−tc in the thickness of the cushioning material 4X on the semiconductor chips 141*a*-1, 141*b*-1 before and after the pressurization of the sintered materials 152*a*-1, 152*b*-1 is 0.8 mm (=1.6−0.8). As described above, a distance Dc from the insulating substrate 132 to the surfaces of the semiconductor chips 141*a*-1, 141*b*-1 is 0.52 mm and is smaller than the amount of change Tc−tc. On this account, the method of manufacturing the semiconductor module of the comparative example does not satisfy the relationship of Formula (1) described above. Because of this, as illustrated in FIG. 8, when the pressure is applied to the cushioning material 4X from the upper hot plate 3X, the cushioning material 4X makes close contact with the semiconductor chips 141*a*-1, 141*b*-1, the sintered materials 152*a*-1, 152*b*-1, the electrically-conductive patterns 134*a*, 134*b*, 134*c*, and the insulating substrate 132. Hereby, in the method of manufacturing the semiconductor module of the comparative example, no space is formed between the cushioning material 4X and the insulating substrate 132.

Accordingly, in the comparative example, there is no space connecting a region sandwiched between the lower hot plate 2X and the upper hot plate 3X to its outside, and therefore, gas Gc discharged from the sintered materials 152*a*-1, 152*b*-1 remains in a region near the sintered materials 152*a*-1, 152*b*-1 inside the cushioning material 4X, as indicated by an arrow Yc in FIG. 8.

Figure 9:
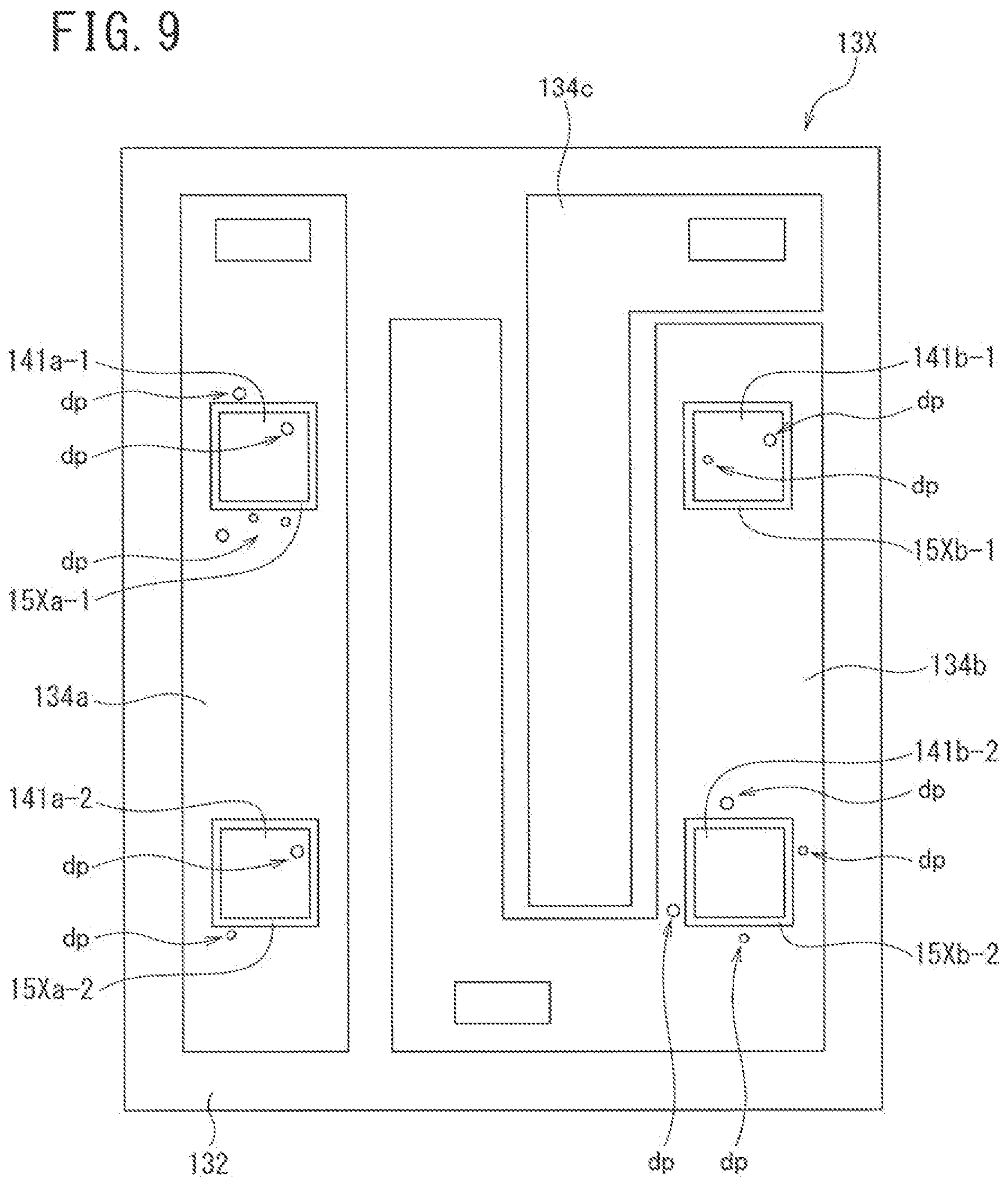
FIG. 9 is a view schematically illustrating an example of a flat surface of an insulating wiring substrate after the sintered material pressurizing and heating step is ended in the method of manufacturing the semiconductor module of the comparative example.

As a result, as illustrated in FIG. 9, deposits dp caused by the gas Gc are generated on the insulating wiring substrate 13X to which the semiconductor chips 141*a*-1, 141*b*-1 have been joined. The deposits dp are generated mainly near sintered bodies 15Xa-1, 15Xb-1 formed by the sintered materials 152*a*-1, 152*b*-1, and the semiconductor chips 141*a*-1, 141*b*-1, for example. Further, the deposits dp are also generated near sintered bodies 15Xa-2, 15Xb-2 formed by sintered materials sintered with the sintered materials 152*a*-1, 152*b*-1, and semiconductor chips 141*a*-2, 141*b*-2 placed on the sintered bodies 15Xa-2, 15Xb-2.

In a case where the deposits dp are generated in connecting parts of lead frames connecting the semiconductor chips 141*a*-1, 141*a*-2, 141*b*-1, 141*b*-2 to the electrically-conductive pattern 134*c*, the solderability of the lead frames decreases. This may cause the lead frames to be detached from the semiconductor chips 141*a*-1, 141*a*-2, 141*b*-1, 141*b*-2 and the electrically-conductive pattern 134*c* during the use of the semiconductor module. Further, voids may occur inside of sealing resin cast into the space of a case in which the insulating wiring substrate 13X and so on are placed, or the sealing resin may peel off from the insulating wiring substrate 13X. This causes such a problem that the reliability of the semiconductor module decreases.

In the meantime, in a case where a cleaning step of clearing the deposits dp to prevent the decrease in the reliability of the semiconductor module is provided after the joining step of joining the semiconductor chips 141*a*-1, 141*b*-1 to the insulating wiring substrate 13X is ended, such a problem occurs that the manufacturing process of the semiconductor module becomes complicated and a manufacturing cost of the semiconductor module increases.

In contrast, in the method of manufacturing the semiconductor module according to the present embodiment, in the sintered material pressurizing and heating step, the sintered materials 151$a$-1, 151$a$-2, 151$b$-1, 151$b$-2 are pressurized and heated to be sintered via the cushioning material 4A and the semiconductor chips 14$a$-1, 14$a$-2, 14$b$-1, 14$b$-2 by the upper hot plate 3 in a state where the spaces 61$a$, 61$b$, 61$c$, 61$d$ are provided between the cushioning material 4A and the parts 131$a$. 131$b$, 131$c$, 131$d$ of the insulating substrate 131. Hereby, the gas G discharged from the sintered materials 151$a$-1, 151$a$-2, 151$b$-1, 151$b$-2 passes through the spaces 61$a$, 61$b$, 61$c$, 61$d$ to be discharged to outside the region sandwiched between the lower hot plate 2 and the upper hot plate 3. Accordingly, in the method of manufacturing the semiconductor module according to the present embodiment, it is possible to prevent deposits caused by the gas G from being generated on the surface of the insulating substrate 131, and the like. As a result, in the method of manufacturing the semiconductor module according to the present embodiment, it is possible to prevent the decrease in the reliability of the semiconductor module 1 and to achieve a reduction in the manufacturing cost.

As described above, in the method of manufacturing the semiconductor module according to the present embodiment, the insulating wiring substrate 13 in which the electrically-conductive patterns 133$a$, 133$b$, 133$c$ are formed on the insulating substrate 131 is placed on the lower hot plate 2, the sintered materials 151$a$-1, 151$a$-2, 151$b$-1, 151$b$-2 are placed on the electrically-conductive patterns 133$a$, 133$b$, the semiconductor chips 14$a$-1, 14$a$-2, 14$b$-1, 14$b$-2 are placed on the sintered materials 151$a$-1, 151$a$-2, 151$b$-1, 151$b$-2, the cushioning material 4A is placed on the semiconductor chips 14$a$-1, 14$a$-2, 14$b$-1, 14$b$-2, the upper hot plate 3 is placed on the cushioning material 4A, and the sintered materials 151$a$-1, 151$a$-2, 151$b$-1, 151$b$-2 are sintered by being pressurized and heated via the cushioning material 4A and the semiconductor chips 14$a$-1, 14$a$-2, 14$b$-1, 14$b$-2 by the upper hot plate 3 in a state where the spaces 61$a$, 61$b$, 61$c$, 61$d$ are provided between the cushioning material 4A and the parts 131$a$, 131$b$, 131$c$, 131$d$ of the insulating substrate 131.

With the method of manufacturing the semiconductor module according to the present embodiment, it is possible to reduce the occurrence of defects in steps after the joining step and reduce the manufacturing cost.

Second Embodiment

A method of manufacturing a semiconductor module according to a second embodiment of the present invention will be described with reference to FIG. 10 and FIG. 11. The method of manufacturing the semiconductor module according to the present embodiment has a feature that each of sintered materials or each set of several sintered materials is individually heated and pressurized via a corresponding one of a plurality of cushioning materials separated from each other. In describing the method of manufacturing the semiconductor module according to the present embodiment, a member having the same action and function as a member used in the method of manufacturing the semiconductor module according to the first embodiment is referred to by the same reference sign as the member used in the method of manufacturing the semiconductor module according to the first embodiment and is not described herein.

(Configuration of Semiconductor Module)

A semiconductor module manufactured by the method of manufacturing the semiconductor module according to the present embodiment is not described herein because the semiconductor module has a configuration similar to that of the semiconductor module manufactured by the method of manufacturing the semiconductor module according to the first embodiment and fulfills a function similar to that of the semiconductor module manufactured by the method of manufacturing the semiconductor module according to the first embodiment.

(Method of Manufacturing Semiconductor Module)

The method of manufacturing the semiconductor module according to the present embodiment is similar to the method of manufacturing the semiconductor module according to the first embodiment except the shape of the cushioning material. In view of this, steps from the sintered material placing step to the sintered material pressurizing and heating step (see FIG. 3) will be described, and the other steps are not described herein. Further, in the description of the method of manufacturing the semiconductor module according to the present embodiment, FIG. 1 to FIG. 3 will be referred to as needed.

Figure 10:
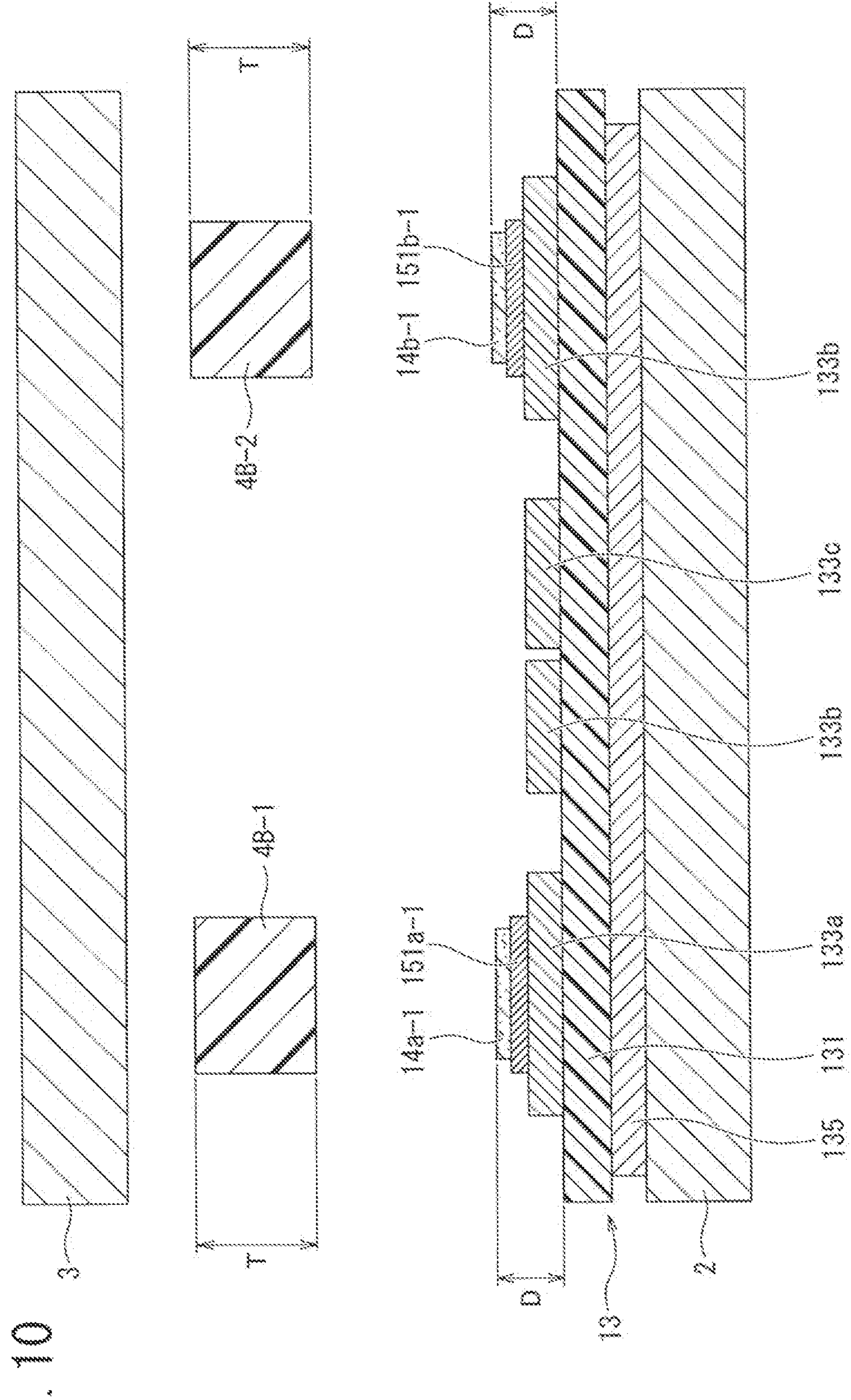
FIG. 10 is a view schematically illustrating steps from an insulating wiring substrate placing step to an upper hot plate placing step in a method of manufacturing a semiconductor module according to a second embodiment of the present invention.

FIG. 10 is a view to describe steps from the sintered material placing step to the upper hot plate placing step and is a sectional view taken along a part corresponding to the line A-A in FIG. 1. FIG. 11 is a view to describe the sintered material pressurizing and heating step and is a sectional view taken along a part corresponding to the line A-A in FIG. 1.

In the joining step in the method of manufacturing the semiconductor module according to the present embodiment, steps from the insulating wiring substrate placing step and the electronic component placing step (see FIG. 3) are performed in a similar manner to the method of manufacturing the semiconductor module according to the first embodiment.

In the sintered material placing step in the present embodiment, a plurality of electrically-conductive patterns 133$a$, 133$b$, 133$c$ is formed on the insulating substrate 131 as illustrated in FIG. 10, and the sintered materials 151$a$-1, 151$b$-1, the sintered material (not illustrated) to form the sintered body 15$b$-2 (see FIG. 1), and the sintered material (not illustrated) to form the sintered body 15$a$-2 (see FIG. 1) are each placed on its corresponding one of at least two (the electrically-conductive patterns 133$a$, 133$b$ in the present embodiment) of the plurality of electrically-conductive patterns 133$a$, 133$b$, 133$c$. The sintered material 151$a$-1 and the sintered material to form the sintered body 15$a$-2 are applied to respective predetermined positions on the electrically-conductive pattern 133$a$ and formed by paste printing. The sintered material 151$b$-1 and the sintered material to form the sintered body 15$b$-2 are applied to respective predetermined positions on the electrically-conductive pattern 133$b$ and formed by paste printing. Hereinafter, for purposes of this description, the sintered material to form the sintered body 15$a$-2 is referred to as the "sintered material 151$a$-2," and the sintered material to form the sintered body 15$b$-2 is referred to as the "sintered material 151$b$-2," although not illustrated herein.

In the electronic component placing step in the present embodiment, electronic components are placed on the sintered materials 151$a$-1, 151$a$-2, 151$b$-1, 151$b$-2, as illustrated in FIG. 10. In the present embodiment, the electronic components are the semiconductor chips 14$a$-1, 14$a$-2, 14$b$-1, 14$b$-2. More specifically, the semiconductor chip 14$a$-1 is placed on the sintered material 151$a$-1 such that the semiconductor chip 14$a$-1 makes contact with the sintered material 151a-1. The semiconductor chip 14a-2 is placed on the sintered material 151a-2 such that the semiconductor chip 14a-2 makes contact with the sintered material 151a-2. The semiconductor chip 14b-1 is placed on the sintered material 151b-1 such that the semiconductor chip 14b-1 makes contact with the sintered material 151b-1. The semiconductor chip 14b-2 is placed on the sintered material 151b-2 such that the semiconductor chip 14b-2 makes contact with the sintered material 151b-2. The distance D from the insulating substrate 131 to the surfaces, of the semiconductor chips 14a-1, 14a-2, on a cushioning material 4B-1 side (described later in detail) is 0.52 mm, for example. Similarly, the distance D from the insulating substrate 131 to the surfaces, of the semiconductor chips 14b-1, 14b-2, on a cushioning material 4B-2 (details thereof will be described later) is 0.52 mm, for example. More specifically, the electrically-conductive patterns 133a, 133b, 133c have a thickness of 0.4 mm, for example, and the semiconductor chips 14a-1, 14a-2, 14b-1, 14b-2 have a thickness of 0.1 mm.

In the cushioning material placing step in the present embodiment, as illustrated in FIG. 10, the cushioning materials 4B-1, 4B-2 are individually placed on respective sets each including sintered materials placed on the same electrically-conductive pattern from among the sintered materials 151a-1, 151a-2, 151b-1, 151b-2, and their corresponding semiconductor chips, from among the semiconductor chips 14a-1, 14a-2, 14b-1, 14b-2, placed on those sintered materials from among the sintered materials 151a-1, 151a-2, 151b-1, 151b-2. More specifically, the sintered material 151a-1, the semiconductor chip 14a-1, the sintered material 151a-2, and the semiconductor chip 14a-2 placed on the electrically-conductive pattern 133a are taken as one set, and the cushioning material 4B-1 is placed on this set. Further, the sintered material 151b-1, the semiconductor chip 14b-1, the sintered material 151b-2, and the semiconductor chip 14b-2 placed on the electrically-conductive pattern 133b are taken as one set, and the cushioning material 4B-2 is placed on this set.

Accordingly, the cushioning material 4B-1 has a rectangular solid shape extending in the same direction as the extending direction of the electrically-conductive pattern 133a. Similarly, the cushioning material 4B-2 has a rectangular solid shape extending in the same direction as the extending direction of the electrically-conductive pattern 133b. Further, the cushioning material 4B-1 and the cushioning material 4B-2 have the same shape. The cushioning materials 4B-1, 4B-2 are made of the same material as that of the cushioning material 4A in the first embodiment and have actions and functions similar to those of the cushioning material 4A in the first embodiment. Further, the cushioning materials 4B-1, 4B-2 have the thickness T (e.g., T=0.6 mm) before the pressurization of the sintered materials 151a-1, 151a-2, 151b-1, 151b-2.

Figure 11:
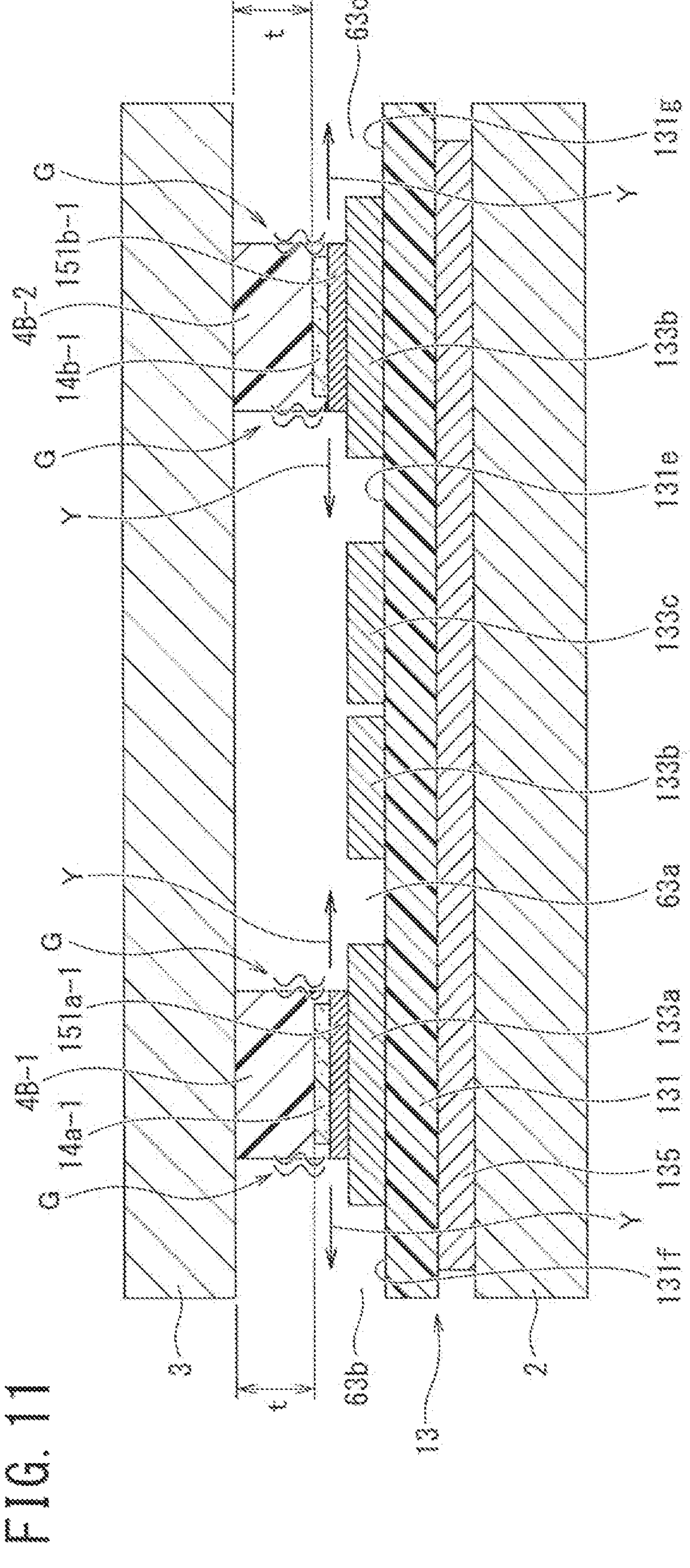
FIG. 11 is a view schematically illustrating a sintered material pressurizing and heating step in the method of manufacturing the semiconductor module according to the second embodiment of the present invention.

In the sintered material pressurizing and heating step subsequent to the upper hot plate placing step in the present embodiment, in a state where spaces 63a, 63b, 63c are provided between the upper hot plate 3 and parts 131e. 131f, 131g of the insulating substrate 131, the sintered materials 151a-1, 151a-2 are sintered by being pressurized and heated by the upper hot plate 3 via the cushioning material 4B-1 and the semiconductor chips 14a-1, 14a-2, and the sintered materials 151b-1, 151b-2 are sintered by being pressurized and heated by the upper hot plate 3 via the cushioning material 4B-2 and the semiconductor chips 14b-1, 14b-2, as illustrated in FIG. 11.

The sintered materials 151a-1, 151a-2 are pressurized by the upper hot plate 3 so that the amount of change in the thickness of the cushioning material 4B-1 on the semiconductor chips 14a-1, 14a-2 before and after the pressurization of the sintered materials 151a-1, 151a-2 is smaller than the distance from the insulating substrate 131 to the surfaces, on the cushioning material 4B-1 side, of the semiconductor chips 14a-1, 14a-2. Similarly, the sintered material 151b-1, 151b-2 are pressurized by the upper hot plate 3 so that the amount of change in the thickness of the cushioning material 4B-2 on the semiconductor chips 14b-1, 14b-2 before and after the pressurization of the sintered materials 151b-1, 151b-2 is smaller than the distance from the insulating substrate 131 to the surfaces, on the cushioning material 4B-2 side, of the semiconductor chips 14b-1, 14b-2.

In the present embodiment, the thickness t of the cushioning materials 4B-1, 4B-2 after the pressurization of the sintered materials 151a-1, 151a-2, 151b-1, 151b-2 is 0.3 mm, for example. The thickness T of the cushioning materials 4B-1, 4B-2 before the pressurization of the sintered materials 151a-1, 151a-2, 151b-1, 151b-2 is 0.6 mm, for example. Further, the distance D from the insulating substrate 131 to the surfaces of the semiconductor chips 14a-1, 14a-2, 14b-1, 14b-2 is 0.52 mm, for example, as described above. Accordingly, the amount of change T−t in the thickness of the cushioning materials 4B-1, 4B-2 before and after the pressurization of the sintered materials 151a-1, 151a-2, 151b-1, 151b-2 is 0.3 mm and is smaller than the distance D. On this account, in the method of manufacturing the semiconductor module according to the present embodiment, the relationship of Formula (1) described above is established.

In the present embodiment, the distance D from the insulating substrate 131 to the surfaces of the semiconductor chips 14a-1, 14a-2, 14b-1, 14b-2 is uniform, but in a case where the surfaces of the semiconductor chips 14a-1, 14a-2, 14b-1, 14b-2 are distanced from the insulating substrate 131 by different distances, the surface of a semiconductor chip having a longest distance from the insulating substrate 131 is targeted for the distance D. Further, in a case where the surface of the semiconductor chip targeted for the distance D has irregularities, a part most distant from the insulating substrate 131 among the irregularities is targeted for the distance D.

Since the relationship of Formula (1) described above is established, the spaces 63a, 63b, 63c are formed between the upper hot plate 3 and the insulating substrate 131. Thus, when the sintered materials 151a-1, 151a-2, 151b-1, 151b-2 are pressurized and heated in a state where the spaces 63a, 63b, 63c are formed, the gas G discharged from the sintered materials 151a-1, 151a-2, 151b-1, 151b-2 passes through the spaces 63a, 63b, 63c to be discharged to outside the region sandwiched between the lower hot plate 2 and the upper hot plate 3, as indicated by arrows Y in FIG. 11. As a result, it is possible to prevent deposits caused by the gas G from being generated on the surface of the insulating substrate 131, and the like after the joining step.

The set including the sintered materials 151a-1, 151a-2 and the semiconductor chips 14a-1, 14a-2 and the set including the sintered materials 151b-1, 151b-2 and the semiconductor chips 14b-1, 14b-2 are linearly symmetric to each other on a virtual straight line passing through the centers of both short sides of the insulating substrate 131 as a symmetric axis. Accordingly, the cushioning material 4B-1 and the cushioning material 4B-2 are also linearly symmetric to each other on the virtual straight line as a symmetric axis. Hereby, the upper hot plate 3 can apply pressures having generally the same strength to the sintered materials 151*a*-1, 151*a*-2 and the sintered materials 151*b*-1, 151*b*-2 via the cushioning materials 4B-1 and the cushioning material 4B-2 partially placed below the upper hot plate 3. Thus, in the method of manufacturing the semiconductor module according to the present embodiment, although the cushioning materials 4B-1, 4B-2 are placed partially, the sintered materials 151*a*-1, 151*a*-2 and the sintered materials 151*b*-1, 151*b*-2 can be pressurized and heater under generally the same condition. Accordingly, in the method of manufacturing the semiconductor module according to the present embodiment, it is possible to form the sintered bodies 15*a*-1, 15*a*-2, 15*b*-1, 15*b*-2 sintered generally in the same state. As a result, it is possible to prevent the joining states of the semiconductor chips 14*a*-1, 14*a*-2, 14*b*-1, 14*b*-2 to the insulating wiring substrate 13 from worsening.

Further, in the method of manufacturing the semiconductor module according to the present embodiment, even when no cushioning material is provided on the electrically-conductive pattern 133*c* formed in a central part of the insulating substrate 131, generally the same pressure can be applied to the sintered materials 151*a*-1, 151*a*-2 and the sintered materials 151*b*-1, 151*b*-2 via the cushioning materials 4B-1, 4B-2. Accordingly, in the method of manufacturing the semiconductor module according to the present embodiment, the cushioning materials 4B-1, 4B-2 should be provided only in given regions including the sintered materials 151*a*-1, 151*a*-2, 151*b*-1, 151*b*-2 targeted for sintering, and therefore, the cushioning materials 4B-1, 4B-2 smaller than the cushioning material 4A in the method of manufacturing the semiconductor module according to the first embodiment can be used. As a result, the method of manufacturing the semiconductor module according to the present embodiment can reduce the manufacturing cost more than the method of manufacturing the semiconductor module according to the first embodiment.

As described above, in the method of manufacturing the semiconductor module according to the present embodiment, the insulating wiring substrate 13 in which the electrically-conductive patterns 133*a*, 133*b*, 133*c* are formed on the insulating substrate 131 is placed on the lower hot plate 2, the sintered materials 151*a*-1, 151*a*-2, 151*b*-1, 151*b*-2 are placed on the electrically-conductive patterns 133*a*, 133*b*, the semiconductor chips 14*a*-1, 14*a*-2, 14*b*-1, 14*b*-2 are placed on the sintered materials 151*a*-1, 151*a*-2, 151*b*-1, 151*b*-2, the cushioning materials 4B-1, 4B-2 are placed on the semiconductor chips 14*a*-1, 14*a*-2, 14*b*-1, 14*b*-2, the upper hot plate 3 is placed on the cushioning materials 4B-1, 4B-2, and the sintered materials 151*a*-1, 151*a*-2, 151*b*-1, 151*b*-2 are sintered by being pressurized and heated via the cushioning material 4B-1, 4B-2 and the semiconductor chips 14*a*-1, 14*a*-2, 14*b*-1, 14*b*-2 by the upper hot plate 3 in a state where the spaces 63*a*, 63*b*, 63*c* are provided between the upper hot plate 3 and the parts 131*e*, 131*f*, 131*g* of the insulating substrate 131.

With the method of manufacturing the semiconductor module according to the present embodiment, it is possible to reduce the occurrence of defects in steps after the joining step and reduce the manufacturing cost.

Further, the cushioning materials 4B-1, 4B-2 are placed individually on respective sets each including sintered materials placed on the same electrically-conductive pattern from among the sintered materials 151*a*-1, 151*a*-2, 151*b*-1, 151*b*-2, and their corresponding semiconductor chips, from among the semiconductor chips 14*a*-1, 14*a*-2, 14*b*-1, 14*b*-2, placed on those sintered materials from among the sintered materials 151*a*-1, 151*a*-2, 151*b*-1, 151*b*-2. Hereby, in the method of manufacturing the semiconductor module according to the present embodiment, the cushioning materials 4B-1, 4B-2 smaller than the cushioning material 4A in the method of manufacturing the semiconductor module according to the first embodiment can be used, thereby making it possible to reduce the manufacturing cost more than the method of manufacturing the semiconductor module according to the first embodiment.

Third Embodiment

A method of manufacturing a semiconductor module according to a third embodiment of the present invention will be described with reference to FIG. 12 to FIG. 14. The method of manufacturing the semiconductor module according to the present embodiment has a feature in that a cushioning material is provided on a part where no sintered material is placed. In describing the method of manufacturing the semiconductor module according to the present embodiment, a member having the same action and function as a member used in the method of manufacturing the semiconductor module according to the first embodiment is referred to by the same reference sign as that of the member used in the method of manufacturing the semiconductor module according to the first embodiment and is not described herein.

(Configuration of Semiconductor Module)

In comparison with the semiconductor module manufactured by the method of manufacturing the semiconductor module according to the first embodiment, a semiconductor module manufactured by the method of manufacturing the semiconductor module according to the present embodiment has a configuration similar to that of the semiconductor module 1 in the first embodiment except the configuration of the insulating wiring substrate. On this account, in the description of the semiconductor module in the present embodiment, FIG. 1 and FIG. 2 will be referred to as needed.

Figure 12:
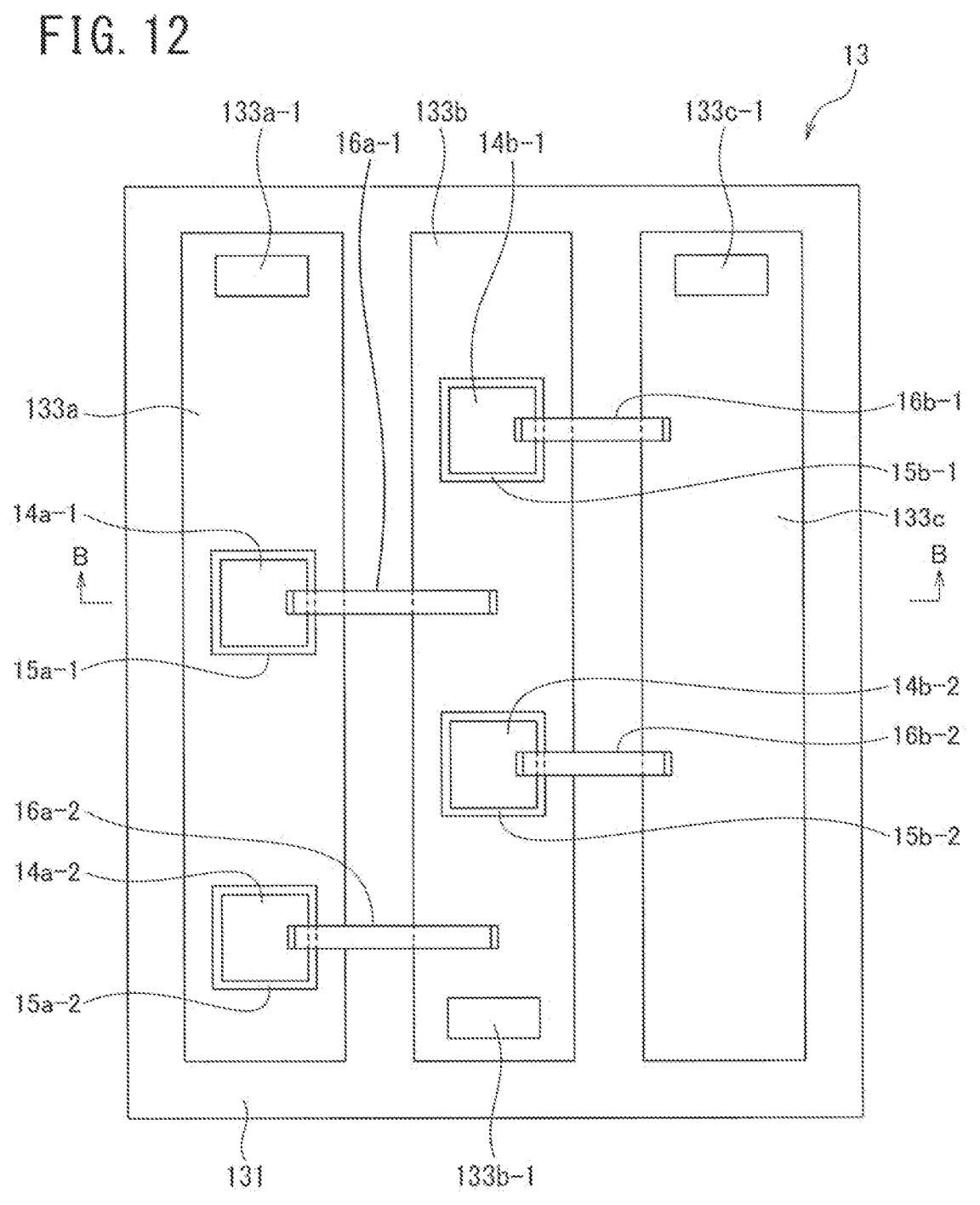

FIG. 12 is a plan view illustrating a schematic configuration of the insulating wiring substrate 13 in the present embodiment. As illustrated in FIG. 12, the insulating wiring substrate 13 has electrically-conductive patterns 133*a*. 133*b*, 133*c* formed on the top surface (the sealing resin 18 side (not illustrated in FIG. 12, see FIG. 2) of the insulating substrate 131. The electrically-conductive patterns 133*a*, 133*b*, 133*c* are made of copper (Cu), for example. The electrically-conductive patterns 133*a*, 133*b*, 133*c* have an oblong shape, for example. The electrically-conductive pattern 133*a* is placed near one long side of the insulating substrate 131, along the one long side. The electrically-conductive pattern 133*c* is placed near the other long side of the insulating substrate 131, along the other long side. The electrically-conductive pattern 133*b* is placed in a central part of the insulating substrate 131 between the electrically-conductive pattern 133*a* and the electrically-conductive pattern 133*c*.

The sintered bodies 15*a*-1, 15*a*-2 and the semiconductor chips 14*a*-1, 14*a*-2 placed on the sintered bodies 15*a*-1, 15*a*-2 are placed on the electrically-conductive pattern 133*a*. The sintered bodies 15*b*-1, 15*b*-2 and the semiconductor chips 14*b*-1, 14*b*-2 placed on the sintered bodies 15*b*-1, 15*b*-2 are placed on the electrically-conductive pattern 133*b*. The semiconductor chip 14*a*-1 is connected to the electrically-conductive pattern 133*b* by the lead frame 16*a*-1. The semiconductor chip 14*a*-2 is connected to the electrically-conductive pattern 133*b* by the lead frame 16*a*-2. The semiconductor chip 14*b*-1 is connected to the electrically-conductive pattern 133*c* by the lead frame 16*b*-1. The semiconductor chip 14*b*-2 is connected to the electrically-conductive pattern 133*c* by the lead frame 16*b*-2.

The positive terminal Pt (not illustrated in FIG. 12, see FIG. 1) is connected to the terminal pattern 133*a*-1 formed in an end part of the electrically-conductive pattern 133*a*. The output terminal Ot (not illustrated in FIG. 12, see FIG. 1) is connected to the terminal pattern 133*b*-1 formed in an end part of the electrically-conductive pattern 133*b*. The negative terminal Nt (not illustrated in FIG. 12, see FIG. 1) is connected to the terminal pattern 133*c*-1 formed in an end part of the electrically-conductive pattern 133*c*.

Thus, in the semiconductor module in the present embodiment, the positive terminal Pt, the negative terminal Nt, the output terminal Ot, the electrically-conductive patterns 133*a*, 133*b*, 133*c*, the sintered bodies 15*a*-1, 15*a*-2, 15*b*-1, 15*b*-2, the semiconductor chips 14*a*-1, 14*a*-2, 14*b*-1, 14*b*-2, and the lead frames 16*a*-1, 16*a*-2, 16*b*-1, 16*b*-2 have connection relationships similar to the connection relationships in the semiconductor module 1. Hereby, the semiconductor module in the present embodiment can fulfill a function similar to that of the semiconductor module 1.

(Method of Manufacturing Semiconductor Module)

The method of manufacturing the semiconductor module according to the present embodiment is similarly to the method of manufacturing the semiconductor module according to the first embodiment except the shape of the cushioning material, and therefore, steps from the sintered material placing step to the sintered material pressurizing and heating step (see FIG. 3) will be described, and the other steps are not described herein. Further, in the description of the method of manufacturing the semiconductor module according to the present embodiment, FIG. 1 to FIG. 3 will be referred to as needed.

Figure 13:
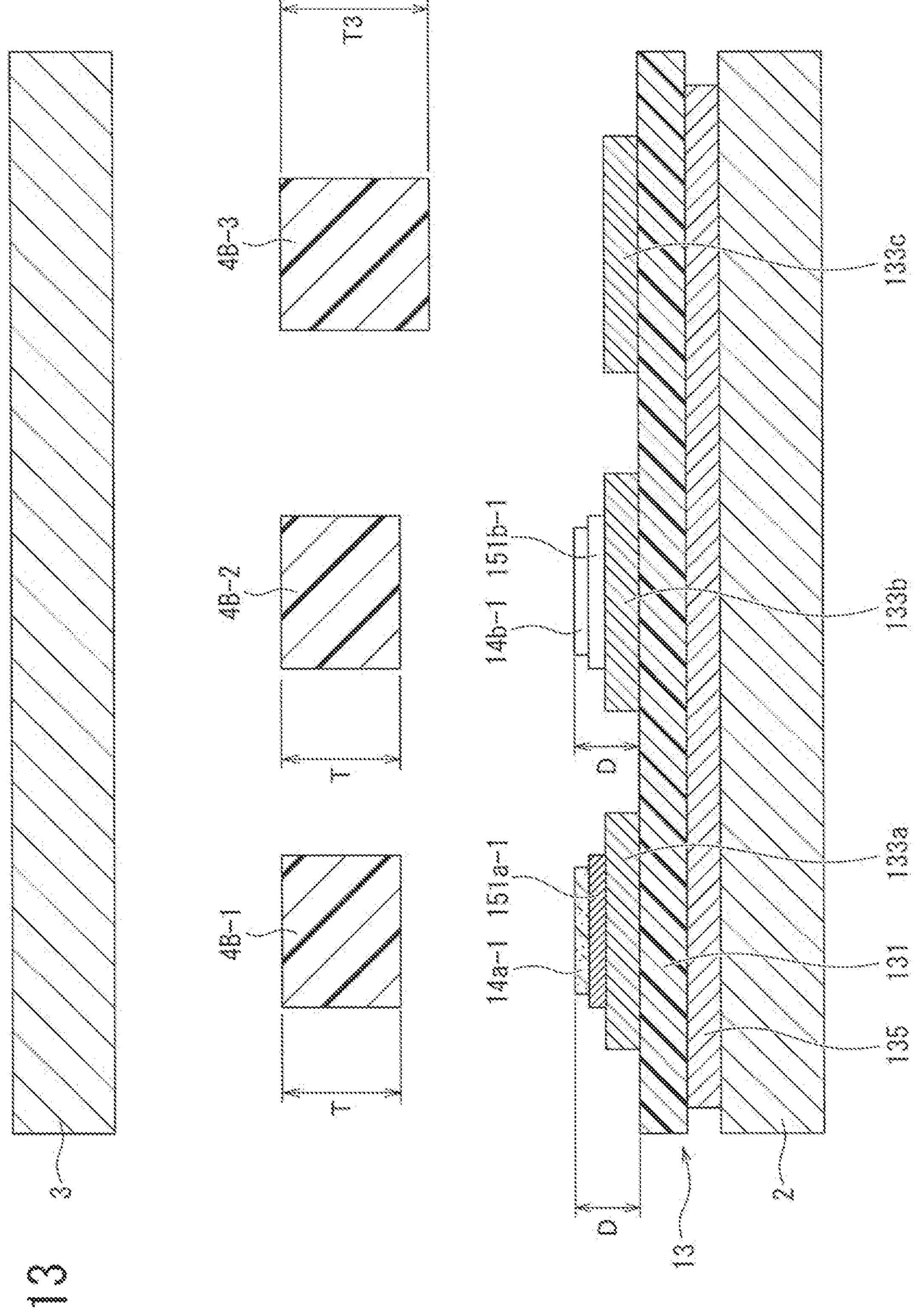
FIG. 13 is a view schematically illustrating steps from an insulating wiring substrate placing step to an upper hot plate placing step in the method of manufacturing the semiconductor module according to the third embodiment of the present invention.

FIG. 13 is a view to describe steps from the sintered material placing step to the upper hot plate placing step and is a sectional view taken along a part corresponding to a line B-B in FIG. 12. FIG. 14 is a view to describe the sintered material pressurizing and heating step and is a sectional view taken along a part corresponding to the line B-B in FIG. 12.

In the joining step in the method of manufacturing the semiconductor module according to the present embodiment, steps from the insulating wiring substrate placing step and the electronic component placing step (see FIG. 3) are performed in a similar manner to the method of manufacturing the semiconductor module according to the first embodiment.

In the sintered material placing step in the present embodiment, a plurality of electrically-conductive patterns 133*a*, 133*b*, 133*c* is formed on the insulating substrate 131, and the sintered materials 151*a*-1, 151*b*-1, the sintered material (not illustrated) to form the sintered body 15*b*-2 (see FIG. 1), and the sintered material (not illustrated) to form the sintered body 15*a*-2 (see FIG. 1) are each placed on its corresponding one of at least two (the electrically-conductive patterns 133*a*, 133*b* in the present embodiment) of the plurality of electrically-conductive patterns 133*a*, 133*b*, 133*c*, as illustrated in FIG. 13. The sintered material 151*a*-1 and the sintered material to form the sintered body 15*a*-2 are applied to respective predetermined positions of the electrically-conductive pattern 133*a* and formed by paste printing. The sintered material 151*b*-1 and the sintered material to form the sintered body 15*b*-2 are applied to respective predetermined positions of the electrically-conductive pattern 133*b* and formed by paste printing. Hereinafter, for purposes of this description, the sintered material to form the sintered body 15*a*-2 is referred to as the "sintered material 151*a*-2," and the sintered material to form the sintered body 15*b*-2 is referred to as the "sintered material 151*b*-2." although not illustrated herein.

In the electronic component placing step in the present embodiment, the semiconductor chips 14*a*-1, 14*a*-2, 14*b*-1, 14*b*-2 (examples of the electronic component) are placed on the sintered materials 151*a*-1, 151*a*-2, 151*b*-1, 151*b*-2, as illustrated in FIG. 13. More specifically, the semiconductor chip 14*a*-1 is placed on the sintered material 151*a*-1 such that the semiconductor chip 14*a*-1 makes contact with the sintered material 151*a*-1. The semiconductor chip 14*a*-2 is placed on the sintered material 151*a*-2 such that the semiconductor chip 14*a*-2 makes contact with the sintered material 151*a*-2. The semiconductor chip 14*b*-1 is placed on the sintered material 151*b*-1 such that the semiconductor chip 14*b*-1 makes contact with the sintered material 151*b*-1. The semiconductor chip 14*b*-2 is placed on the sintered material 151*b*-2 such that the semiconductor chip 14*b*-2 makes contact with the sintered material 151*b*-2. The distance D from the insulating substrate 131 to the surfaces, on the cushioning material 4B-1 side, of the semiconductor chips 14*a*-1, 14*a*-2 is 0.52 mm, for example. Similarly, the distance D from the insulating substrate 131 to the surfaces, on the cushioning material 4B-2 side, of the semiconductor chips 14*a*-1, 14*a*-2 is 0.52 mm, for example. More specifically, the electrically-conductive patterns 133*a*, 133*b*, 133*c* have a thickness of 0.4 mm, for example, and the semiconductor chips 14*a*-1, 14*a*-2, 14*b*-1, 14*b*-2 have a thickness of 0.1 mm, for example.

In the cushioning material placing step in the present embodiment, the cushioning materials 4B-1, 4B-2 are placed individually on respective sets each including sintered materials placed on the same electrically-conductive pattern from among the sintered materials 151*a*-1, 151*a*-2, 151*b*-1, 151*b*-2, and their corresponding semiconductor chips, from among the semiconductor chips 14*a*-1, 14*a*-2, 14*b*-1, 14*b*-2, placed on those sintered materials from among the sintered materials 151*a*-1, 151*a*-2, 151*b*-1, 151*b*-2, as illustrated in FIG. 13. More specifically, the sintered material 151*a*-1, the semiconductor chip 14*a*-1, the sintered material 151*a*-2, and the semiconductor chip 14*a*-2 placed on the electrically-conductive pattern 133*a* are taken as one set, and the cushioning material 4B-1 is placed on this set. Further, the sintered material 151*b*-1, the semiconductor chip 14*b*-1, the sintered material 151*b*-2, and the semiconductor chip 14*b*-2 placed on the electrically-conductive pattern 133*b* are taken as one set, and the cushioning material 4B-2 is placed on this set.

Accordingly, the cushioning material 4B-1 has a rectangular solid shape extending in the same direction as the extending direction of the electrically-conductive pattern 133*a*. Similarly, the cushioning material 4B-2 has a rectangular solid shape extending in the same direction as the extending direction of the electrically-conductive pattern 133*b*. Further, the cushioning material 4B-1 and the cushioning material 4B-2 have the same shape. The cushioning materials 4B-1, 4B-2 are made of the same material as that of the cushioning material 4A in the first embodiment and have actions and functions similar to those of the cushioning material 4A in the first embodiment. Further, the cushioning materials 4B-1, 4B-2 further have the thickness T (e.g., T=0.6 mm) before the sintered materials 151*a*-1, 151*a*-2, 151*b*-1, 151*b*-2 are pressurized.

However, when a virtual straight line passing through the centers of both short sides of the insulating substrate 131 is taken as a symmetric axis, the electrically-conductive pattern 133*a* and the electrically-conductive pattern 133*b* are not linearly symmetric to each other. Because of this, w % ben the virtual straight line is taken as a symmetric axis, the set including the sintered materials 151*a*-1, 151*a*-2 and the semiconductor chips 14*a*-1, 14*a*-2 placed on the electrically-conductive pattern 133*a* and the set including the sintered materials 151*b*-1, 151*b*-2 and the semiconductor chips 14*b*-1, 14*b*-2 placed on the electrically-conductive pattern 133*b* are not linearly symmetric to each other. Accordingly, when the virtual straight line is taken as a symmetric axis, the cushioning material 4B-1 placed on the set including the sintered materials 151*a*-1, 151*a*-2 and the semiconductor chips 14*a*-1, 14*a*-2 placed on the electrically-conductive pattern 133*a* and the cushioning material 4B-2 placed on the set including the sintered materials 151*b*-1, 151*b*-2 and the semiconductor chips 14*b*-1, 14*b*-2 placed on the electrically-conductive pattern 133*b* are also not linearly symmetric to each other. Accordingly, it is difficult for the upper hot plate 3 to apply generally the same pressure to the sintered materials 151*a*-1, 151*a*-2 and the sintered materials 151*b*-1, 151*b*-2 only by the cushioning materials 4B-1, 4B-2.

In view of this, in the method of manufacturing the semiconductor module according to the present embodiment, in the cushioning material placing step, on at least one electrically-conductive pattern (in the present embodiment, the electrically-conductive pattern 133*c*) on which any of the sets is not placed, from among the plurality of electrically-conductive patterns 133*a*, 133*b*, 133*c*, a cushioning material 4B-3 different from the cushioning materials 4B-1, 4B-2 on those sets is placed. Although details are described later, the cushioning material 4B-3 has a thickness thicker than those of the cushioning materials 4B-1, 4B-2 just by the thicknesses of the semiconductor chips and the sintered materials.

Figure 14:
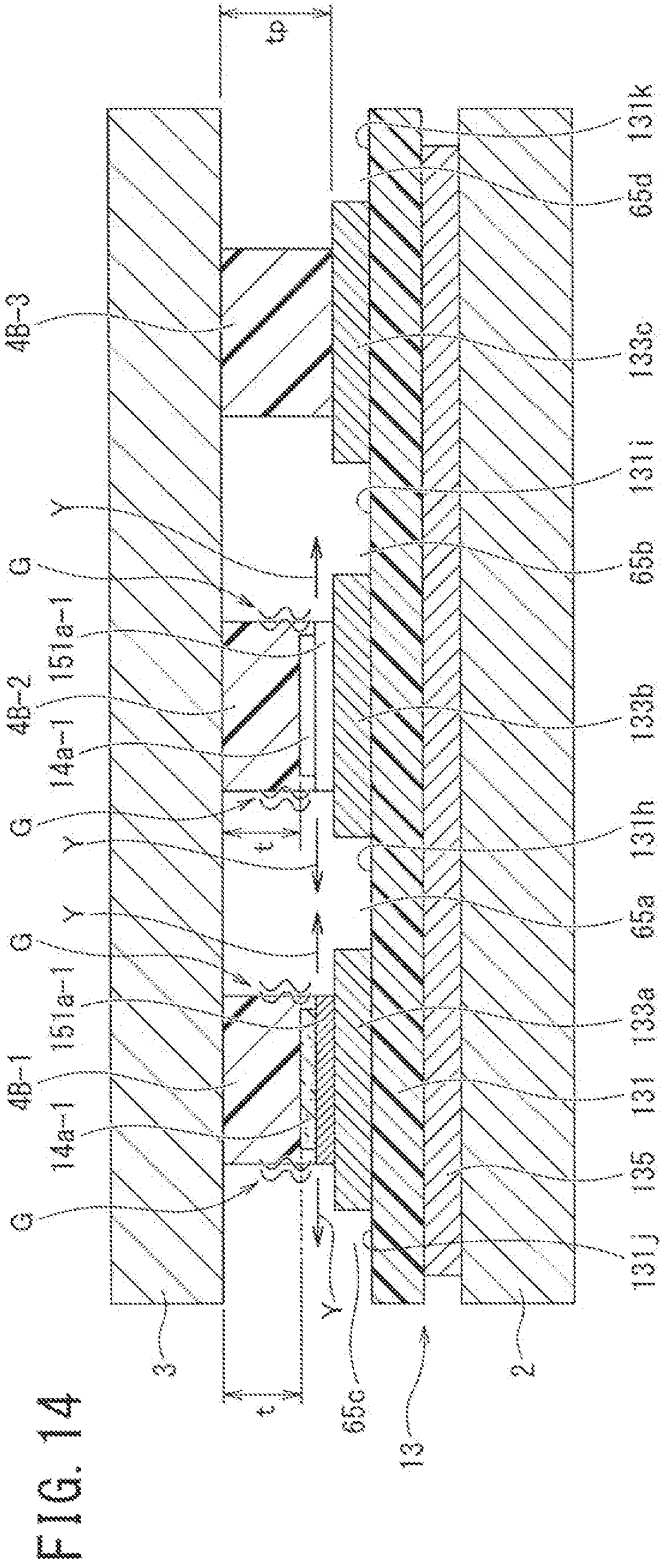
FIG. 14 is a view schematically illustrating a sintered material pressurizing and heating step in the method of manufacturing the semiconductor module according to the third embodiment of the present invention.

In the sintered material pressurizing and heating step subsequent to the upper hot plate placing step in the present embodiment, in a state where spaces 65*a*. 65*b*, 65*c*, 65*d* are provided between the upper hot plate 3 and parts 131*h*, 131*i*, 131*j*, 131*k* of the insulating substrate 131, the sintered materials 151*a*-1, 151*a*-2 are sintered by being pressurized and heated by the upper hot plate 3 via the cushioning material 4B-1 and the semiconductor chips 14*a*-1, 14*a*-2, and the sintered materials 151*b*-1, 151*b*-2 are sintered by being pressurized and heated by the upper hot plate 3 via the cushioning material 4B-2 and the semiconductor chips 14*b*-1, 14*b*-2, as illustrated in FIG. 14. At the time when the sintered materials 151*a*-1, 151*a*-2, 151*b*-1, 151*b*-2 are sintered, the cushioning material 4B-3 makes contact with the electrically-conductive pattern 133*c*. Accordingly, even when the sintered materials 151*a*-1, 151*a*-2 and the sintered materials 151*b*-1, 151*b*-2 are not placed to be symmetric to each other in the insulating substrate 131, the upper hot plate 3 can apply generally the same pressure to the sintered materials 151*a*-1, 151*a*-2 and the sintered materials 151*b*-1, 151*b*-2.

The sintered material 151*a*-1, 151*a*-2 are pressurized by the upper hot plate 3 so that the amount of change in the thickness of the cushioning material 4B-1 on the semiconductor chips 14*a*-1, 14*a*-2 before and after the pressurization of the sintered materials 151*a*-1, 151*a*-2 is smaller than the distance from the insulating substrate 131 to the surfaces, on the cushioning material 4B-1 side, of the semiconductor chips 14*a*-1, 14*a*-2. Similarly, the sintered material 151*b*-1, 151*b*-2 are pressurized by the upper hot plate 3 so that the amount of change in the thickness of the cushioning material 4B-2 on the semiconductor chips 14*b*-1, 14*b*-2 before and after the pressurization of the sintered materials 151*b*-1, 151*b*-2 is smaller than the distance from the insulating substrate 131 to the surfaces, on the cushioning material 4B-2 side, of the semiconductor chips 14*b*-1, 14*b*-2. The cushioning material 4B-3 has a thickness that does not hinder the amount of change in the thicknesses of the cushioning materials 4B-1, 4B-2 before and after the pressurization of the sintered materials 151*a*-1, 151*a*-2, 151*b*-1, 151*b*-2, and the thickness of the cushioning material 4B-3 changes before and after the pressurization.

In the present embodiment, the thickness t of the cushioning materials 4B-1, 4B-2 after the sintered materials 151*a*-1, 151*a*-2, 151*b*-1, 151*b*-2 are pressurized is 0.3 mm, for example. The thickness T of the cushioning materials 4B-1, 4B-2 before the pressurization of the sintered materials 151*a*-1, 151*a*-2, 151*b*-1, 151*b*-2 is 0.6 mm, for example. Further, the distance D from the insulating substrate 131 to the surfaces of the semiconductor chips 14*a*-1, 14*a*-2, 14*b*-1, 14*b*-2 is 0.52 mm, for example, as described above. Accordingly, the amount of change T−t in the thickness of the cushioning materials 4B-1, 4B-2 before and after the pressurization of the sintered materials 151*a*-1, 151*a*-2, 151*b*-1, 151*b*-2 is 0.3 mm and is smaller than the distance D. On this account, in the method of manufacturing the semiconductor module according to the present embodiment, the relationship of Formula (1) described above is established.

The cushioning material 4B-3 before the pressurization of the sintered materials 151*a*-1, 151*a*-2, 151*b*-1, 151*b*-2 has a thickness T3 of 0.72 mm (0.6+0.1+0.02), for example, that is thicker than the thickness T just by the thicknesses of the semiconductor chips and the sintered materials. Since the cushioning material 4B-3 has an elastic modulus similar to those of the cushioning materials 4B-1, 4B-2, when the cushioning material 4B-3 is pressurized by the upper hot plate 3, the thickness of the cushioning material 4B-3 changes only by the same amount as the amount of change in the thickness of the cushioning materials 4B-1, 4B-2. Accordingly, when the pressure is applied to the cushioning materials 4B-1, 4B-2, 4B-3 from the upper hot plate 3, the cushioning materials 4B-1, 4B-2, 4B-3 can maintain the spaces 65*a*, 65*b*, 65*c*, 65*d* between the upper hot plate 3 and the insulating substrate 131 to have generally the same length.

In the present embodiment, the distance D from the insulating substrate 131 to each of the surfaces of the semiconductor chips 14*a*-1, 14*a*-2, 14*b*-1, 14*b*-2 is uniform, but in a case where the surfaces of the semiconductor chips 14*a*-1, 14*a*-2, 14*b*-1, 14*b*-2 are distanced from the insulating substrate 131 by different distances, the surface of a semiconductor chip having a longest distance from the insulating substrate 131 is targeted for the distance D. Further, in a case where the surface of the semiconductor chip targeted for the distance D has irregularities, a part most distant from the insulating substrate 131 among the irregularities is targeted for the distance D.

In the present embodiment, the relationship of Formula (1) described above is established by placing the cushioning material 4B-3 in a part where no sintered material is placed, and hereby, the spaces 65*a*, 65*b*, 65*c*, 65*d* are formed between the upper hot plate 3 and the insulating substrate 131. When the sintered materials 151*a*-1, 151*a*-2, 151*b*-1, 151*b*-2 are pressurized and heated in a state where the spaces 65*a*, 65*b*, 65*c*, 65*d* are formed as such, the gas G discharged from the sintered materials 151*a*-1, 151*a*-2, 151*b*-1, 151*b*-2 passes through the spaces 65*a*, 65*b*, 65*c*, 65*d* to be discharged to outside the region sandwiched between the lower hot plate 2 and the upper hot plate 3, as indicated by arrows Y in FIG. 14. As a result, it is possible to prevent deposits caused by the gas G from being generated on the surface of the insulating substrate 131, and the like after the joining step.

Further, in the method of manufacturing the semiconductor module according to the present embodiment, the cushioning materials 4B-1, 4B-2, 4B-3 smaller than the cushioning material 4A in the method of manufacturing the semiconductor module according to the first embodiment can be used, similarly to the method of manufacturing the semiconductor module according to the second embodiment. As a result, the method of manufacturing the semiconductor module according to the present embodiment can reduce the manufacturing cost more than the method of manufacturing the semiconductor module according to the first embodiment.

Further, in the method of manufacturing the semiconductor module according to the present embodiment, even when the sintered materials 151*a*-1, 151*a*-2 and the sintered materials 151*b*-1, 151*b*-2 are placed to be asymmetric to each other on the insulating substrate 131, generally the same pressure can be applied to the sintered materials 151*a*-1, 151*a*-2 and the sintered materials 151*b*-1, 151*b*-2. Hereby, in the method of manufacturing the semiconductor module according to the present embodiment, it is possible to form the sintered bodies 15*a*-1, 15*a*-2, 15*b*-1, 15*b*-2 sintered generally in the same state. As a result, it is possible to prevent the joining states of the semiconductor chips 14*a*-1, 14*a*-2, 14*b*-1, 14*b*-2 to the insulating wiring substrate 13 from worsening.

As described above, in the method of manufacturing the semiconductor module according to the present embodiment, the insulating wiring substrate 13 in which the electrically-conductive patterns 133*a*, 133*b*, 133*c* are formed on the insulating substrate 131 is placed on the lower hot plate 2, the sintered materials 151*a*-1, 151*a*-2, 151*b*-1, 151*b*-2 are placed on the electrically-conductive patterns 133*a*, 133*b*, the semiconductor chips 14*a*-1, 14*a*-2, 14*b*-1, 14*b*-2 are placed on the sintered materials 151*a*-1, 151*a*-2, 151*b*-1, 151*b*-2, the cushioning materials 4B-1, 4B-2 are placed on the semiconductor chips 14*a*-1, 14*a*-2, 14*b*-1, 14*b*-2, the upper hot plate 3 is placed on the cushioning materials 4B-1, 4B-2, and the sintered materials 151*a*-1, 151*a*-2, 151*b*-1, 151*b*-2 are sintered by being pressurized and heated via the cushioning materials 4B-1, 4B-2 and the semiconductor chips 14*a*-1, 14*a*-2, 14*b*-1, 14*b*-2 by the upper hot plate 3 in a state where the spaces 65*a*, 65*b*, 65*c*, 65*d* are provided between the upper hot plate 3 and the parts 131*h*, 131*i*, 131*j*, 131*k* of the insulating substrate 131.

With the method of manufacturing the semiconductor module according to the present embodiment, it is possible to reduce the occurrence of defects in steps after the joining step and reduce the manufacturing cost.

Further, the cushioning materials 4B-1, 4B-2 are placed individually on respective sets each including sintered materials placed on the same electrically-conductive pattern from among the sintered materials 151*a*-1, 151*a*-2, 151*b*-1, 151*b*-2, and their corresponding semiconductor chips, from among the semiconductor chips 14*a*-1, 14*a*-2, 14*b*-1, 14*b*-2, placed on those sintered materials from among the sintered materials 151*a*-1, 151*a*-2, 151*b*-1, 151*b*-2. Hereby, the method of manufacturing the semiconductor module according to the present embodiment can achieve effects similar to those of the method of manufacturing the semiconductor module according to the second embodiment.

Further, in the method of manufacturing the semiconductor module according to the present embodiment, even when the sintered materials 151*a*-1, 151*a*-2 and the sintered materials 151*b*-1, 151*b*-2 are placed to be asymmetric to each other on the insulating substrate 131, generally the same pressure can be applied to the sintered materials 151*a*-1, 151*a*-2 and the sintered materials 151*b*-1, 151*b*-2. Hereby, with the method of manufacturing the semiconductor module according to the present embodiment, it is possible to prevent the joining states of the semiconductor chips 14*a*-1, 14*a*-2, 14*b*-1, 14*b*-2 to the insulating wiring substrate 13 from worsening.

The present invention is not limited to the first to third embodiments, and various modifications can be made. In the first embodiment to the third embodiment, a semiconductor chip including a power semiconductor element and a freewheeling diode is provided as the electronic component, but the present invention can be applied to joining of semiconductor chips each individually including a power semiconductor element or a freewheeling diode to a passive element such as a resistance element, a capacitance element, or an inductor.

The method of manufacturing the semiconductor modules according to the first embodiment to the third embodiment may include a step of placing a protection sheet (e.g., a sheet made of aluminum or Teflon (registered trademark)) for protecting an electronic component, between the cushioning material placing step and the electronic component placing step.

The first embodiment to the third embodiment deal with a wiring structure in which a semiconductor chip is connected to an electrically-conductive pattern by a lead frame, but the present invention is not limited to this. For example, the semiconductor module manufactured by the method of manufacturing the semiconductor module according to the present invention may have an implanted-pin structure using an implanted-pin substrate in which pins are joined onto the principal surface of a semiconductor chip to be used as electric wiring. Further, for example, the semiconductor module manufactured by the method of manufacturing the semiconductor module according to the present invention may have a wiring structure using wire bonding.

The technical scope of the present invention is not limited to the exemplary embodiments illustrated and described herein and covers all embodiments that provide effects equivalent to those intended by the present invention. Further, the technical scope of the present invention is not limited to combinations of features of the invention defined by Claims but can be defined by any desired combination of specific features among the features disclosed herein.

The invention claimed is:

1. A method of manufacturing a semiconductor module comprising:

placing, on a lower hot plate, an insulating wiring substrate having an electrically-conductive pattern formed on an insulating substrate;

placing sinterable materials on the electrically-conductive pattern;

placing electronic components on the sinterable materials;

placing a cushioning material over the electronic components;

placing an upper hot plate on the cushioning material;

pressing the upper hot plate and the lower hot plate together so as to press the cushioning material, the electronic components, the sinterable materials, and the insulating wiring substrate together such that at least a portion of the cushioning material that corresponds to the electronic components becomes compressed and so as to form a space between the upper hot plate and the insulating substrate; and with the upper hot plate and the lower hot plate pressed together, heating, by the upper hot plate, the sinterable materials via the cushioning material and the electronic components such that gas released from the sinterable materials is dischargeable through the space and the sinterable materials become sintered to join the electronic components to the electrically-conductive pattern of the insulating wiring substrate.

2. The method of manufacturing the semiconductor module according to claim 1, wherein the sinterable materials are pressurized by the upper hot plate such that an amount of change in a thickness of the at least a portion of the cushioning material before and after the pressing is smaller than a distance from the insulating substrate to surfaces, on a cushioning material side, of the electronic components.

3. The method of manufacturing the semiconductor module according to claim 1, wherein the cushioning material is a single cushioning material, and the placing includes placing the single cushioning material over the electronic components such that the single cushioning material is brought into contact with respective surfaces, on an upper hot plate side, of the electrically-conductive pattern, the sinterable materials, and the electronic components.

4. The method of manufacturing the semiconductor module according to claim 3, wherein the space is provided between another portion of the cushioning material and the insulating substrate.

5. The method of manufacturing the semiconductor module according to claim 3, wherein the pressing includes making no contact between the cushioning material and the insulating substrate.

6. The method of manufacturing the semiconductor module according to claim 4, wherein the pressing includes making no contact between the cushioning material and the insulating substrate.

7. The method of manufacturing the semiconductor module according to claim 1, wherein:

the electrically-conductive pattern includes a plurality of electrically-conductive patterns formed on the insulating substrate;

the sinterable materials are placed on each of at least two of the plurality of electrically-conductive patterns;

the electronic components are placed on the sinterable materials; and the cushioning material includes a plurality of cushioning materials and cushioning materials from among the plurality of cushioning materials are individually placed on a set from among a plurality of sets, each set from among the plurality of sets including sinterable materials placed on a same electrically-conductive pattern from among the plurality of electrically-conductive patterns and electronic components placed on the sinterable materials.

8. The method of manufacturing the semiconductor module according to claim 7, wherein the plurality of cushioning materials further includes a cushioning material having a different thickness from other cushioning materials from among the plurality of cushioning materials, and the cushioning material having a different thickness is placed on at least one electrically-conductive pattern from among the plurality of electrically-conductive patterns on which no set is placed.

9. The method of manufacturing the semiconductor module according to claim 1, wherein the electronic components are semiconductor chips.

10. The method of manufacturing the semiconductor module according to claim 1, wherein the heating further includes heating, by the lower hot plate, the sinterable materials via insulating wiring substrate such that the sinterable materials release the gas so as to be discharged through the space and the sinterable materials becomes sintered thereby joining the electronic components to the electrically-conductive pattern by the sinterable materials being sintered.

11. The method of manufacturing the semiconductor module according to claim 10, wherein the heating, by the lower hot plate and the heating, by the upper hot plate, is simultaneous.

12. The method of manufacturing the semiconductor module according to claim 1, wherein the at least a portion of the cushioning material is a first portion of the cushioning material that corresponds to the electronic components that becomes compressed, and a second portion of the cushioning material that does not correspond to the electronic components is not compressed and is spaced apart from the insulating substrate so as to form a space between the second portion of the cushioning material and the insulating substrate.

13. The method of manufacturing the semiconductor module according to claim 1, wherein the cushioning material is constituted by a carbon sheet.

* * * * *